United States Patent
Farrar

(10) Patent No.: US 6,510,080 B1
(45) Date of Patent: Jan. 21, 2003

(54) THREE TERMINAL MAGNETIC RANDOM ACCESS MEMORY

(75) Inventor: Paul A. Farrar, So. Burlington, VT (US)

(73) Assignee: Micron Technology Inc., Boise, ID (US)

(*) Notice: Subject to any disclaimer, the term of this patent is extended or adjusted under 35 U.S.C. 154(b) by 0 days.

(21) Appl. No.: 09/940,976

(22) Filed: Aug. 28, 2001

(51) Int. Cl.$^7$ ................................................ G11C 11/14
(52) U.S. Cl. ........................... 365/171; 365/173; 365/87
(58) Field of Search ................................. 365/173, 171, 365/87, 55, 74, 97, 225.5, 209

(56) References Cited

U.S. PATENT DOCUMENTS

| | | | |
|---|---|---|---|
| 4,780,848 A | 10/1988 | Daughton et al. | 365/173 |
| 5,587,943 A | 12/1996 | Torok et al. | 365/158 |
| 5,640,343 A | 6/1997 | Gallagher et al. | 365/171 |
| 5,748,524 A | 5/1998 | Chen et al. | 365/173 |
| 5,793,697 A | 8/1998 | Scheuerlein | 365/230.07 |
| 5,861,328 A | 1/1999 | Tehrani et al. | 438/210 |
| 5,956,267 A | 9/1999 | Hurst et al. | 365/158 |
| 5,966,323 A | 10/1999 | Chen et al. | 365/158 |
| 6,005,800 A | 12/1999 | Koch et al. | 365/173 |
| 6,034,887 A | 3/2000 | Gupta et al. | 365/171 |
| 6,081,446 A * | 6/2000 | Brug et al. | 365/171 |
| 6,097,625 A | 8/2000 | Scheuerlein et al. | 365/171 |
| 6,104,633 A | 8/2000 | Abraham et al. | 365/171 |
| 6,134,139 A | 10/2000 | Bhattacharyya et al. | 365/171 |
| 6,166,948 A | 12/2000 | Parkin et al. | 365/173 |
| 6,172,904 B1 | 1/2001 | Anthony et al. | 365/173 |
| 6,174,737 B1 | 1/2001 | Durlam et al. | 438/3 |
| 6,191,972 B1 | 2/2001 | Miura et al. | 365/171 |
| 6,191,973 B1 | 2/2001 | Moyer | 365/173 |
| 6,211,090 B1 | 4/2001 | Durlam et al. | 438/692 |
| 6,211,559 B1 | 4/2001 | Zhu et al. | 257/421 |
| 6,219,212 B1 | 4/2001 | Gill et al. | 360/324.2 |
| 6,219,275 B1 | 4/2001 | Nishimura | 365/173 |
| 6,226,160 B1 | 5/2001 | Gallagher et al. | 360/324.2 |
| 6,233,172 B1 | 5/2001 | Chen et al. | 365/173 |
| 6,242,770 B1 | 6/2001 | Bronner et al. | 257/295 |
| 6,256,223 B1 | 7/2001 | Sun et al. | 365/171 |
| 6,256,247 B1 | 7/2001 | Perner | 365/209 |
| 6,259,586 B1 | 7/2001 | Gill | 360/324.2 |
| 6,269,018 B1 | 7/2001 | Monsma et al. | 365/145 |

\* cited by examiner

*Primary Examiner*—David Nelms
*Assistant Examiner*—David Lam
(74) *Attorney, Agent, or Firm*—Schwegman, Lundberg, Woessner & Kluth, P.A.

(57) ABSTRACT

Three terminal magnetic random access memory structures and methods. One aspect is a memory cell. One embodiment of the memory cell includes a first conductor line, a second conductor line, a third conductor line, and a magnetic storage element. The magnetic storage element is operably positioned to be magnetically coupled to first, second and third magnetic fields produced by energized first, second and third conductor lines, respectively. The magnetic storage element is adapted to be written by a vector sum of the first, second and third magnetic fields. One aspect is a method for writing to a magnetic storage device. According to one embodiment of this method, first, second and third magnetic field vectors are formed at the magnetic storage device. The magnetic storage device is written by a vector sum of the first, second and third magnetic field vectors.

73 Claims, 18 Drawing Sheets

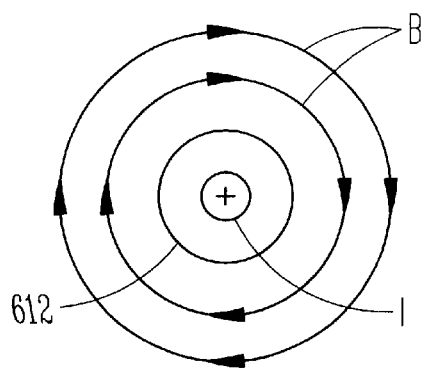
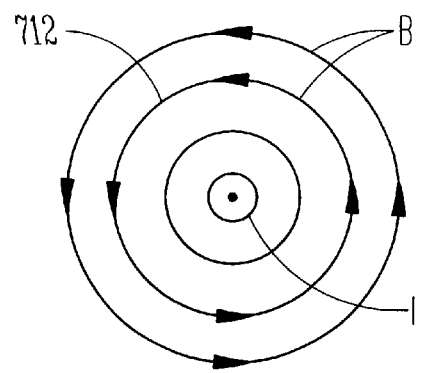
Fig.6
(Prior Art)
Fig.7
(Prior Art)
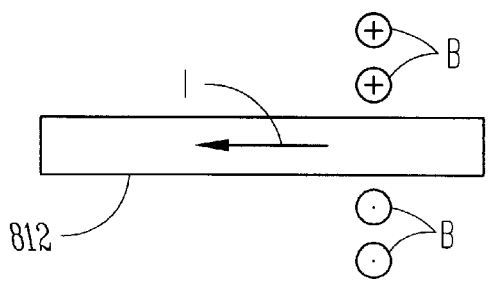
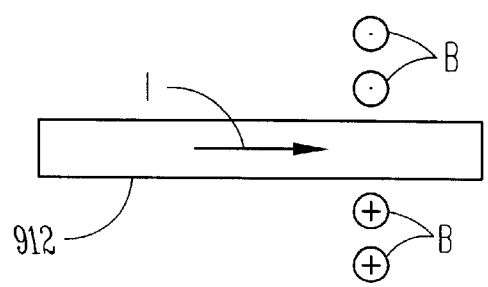
Fig.8
(Prior Art)
Fig.9
(Prior Art)

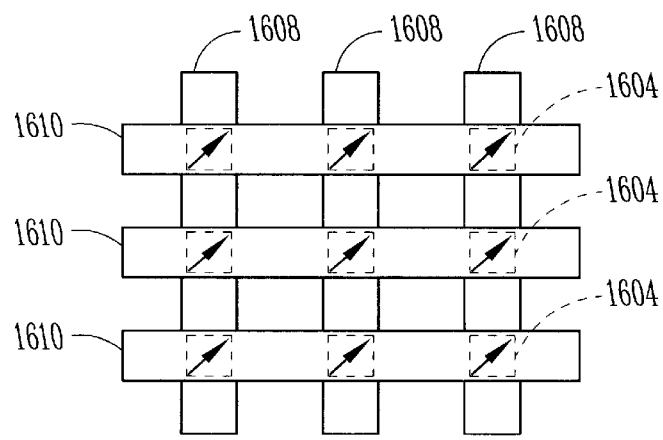
Fig.16
(Prior Art)
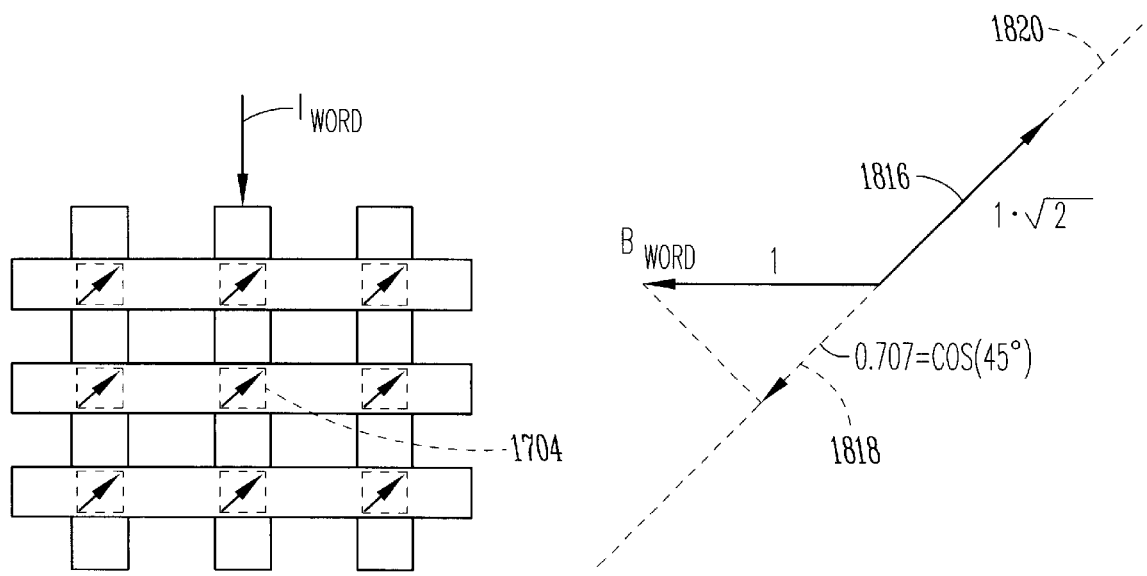
Fig.17
(Prior Art)
Fig.18
(Prior Art)

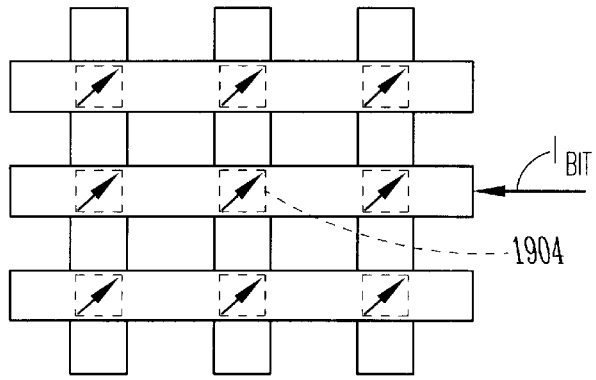
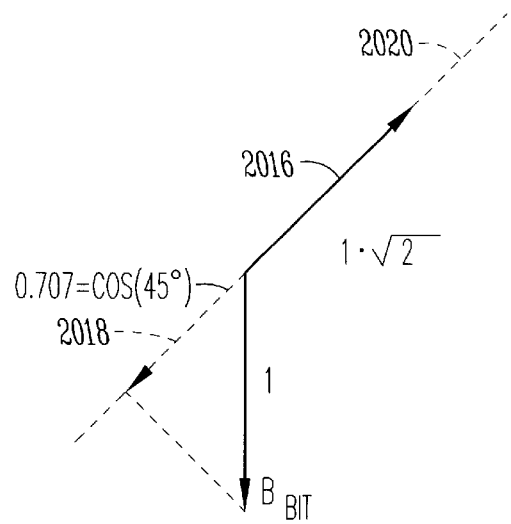
Fig.19
(Prior Art)
Fig.20
(Prior Art)
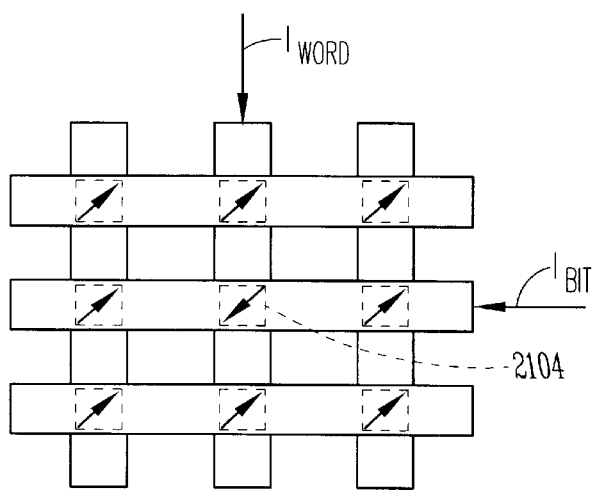
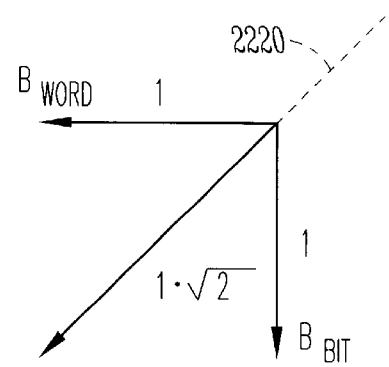
Fig.21
(Prior Art)
Fig.22
(Prior Art)

$1.5 = -B_{SELECT} + -B_{WORD} \cdot COS(60°) + -B_{BIT} \cdot COS(60°)$ $1.5 = B_{SELECT} + B_{WORD} \cdot \cos(60°) + B_{BIT} \cdot \cos(60°)$

THREE TERMINAL MAGNETIC RANDOM ACCESS MEMORY

TECHNICAL FIELD OF THE INVENTION

This invention relates generally to integrated circuits and, more particularly, to nonvolatile memory arrays that use magnetic memory elements.

BACKGROUND OF THE INVENTION

The semiconductor industry continuously strives to reduce the size and cost of memory, increase the speed for accessing memory, and improve the reliability of memory. One particular problem confronting the semiconductor industry is that of reducing the size of the memory cell in a Random Access Memory (RAM).

During the 1950s and 1960s, magnetic core memories were the predominant storage technology for the working memory of computing systems. The magnetic core memory technology was costly, and as the need for more fast on-line storage grew, there was no economical path to minimize the technology. At this time, it was proposed to supplant these devices with high density arrays of magnetic devices.

In the 1970s, magnetic core memories were replaced with integrated circuits, including static random access memory (SRAM) and including dynamic random ccess memory (DRAM) that is be periodically refreshed at frequent intervals. Non-volatile memories have been developed to address the problem of data volatility. For example, non-volatile memories include Electrically Erasable Programmable Read Only Memory (EEPROM) such as FLASH memory. Because of the rapid advancement in semiconductor density coupled with the advent of the DRAM cell, magnetic storage technology was not used for high-speed on-line memory, but rather was left to be used for low-cost, high-density memory in the form of various disk drive technologies.

It has been proposed to use magnetic storage such as Magnetic Random Access Memory (MRAM) technology as a replacement or supplement to the DRAM. In the MRAM structures that are being proposed, the capacitor storage element of the DRAM cell is replaced by a magnetic element. The magnetic element has a magnetic moment and is characterized by a predominant or easy axis of magnetization. In the absence of an external magnetic field, the magnetic moment is oriented along the easy axis of magnetization in one of two stable states. In magnetoresistance technology, one of the stable states for the magnetic moment of the magnetic element is a high resistance state and the other of the stable states is a low resistance state.

It has been proposed to construct a cross point array which would have a significant density advantage. In this device, the magnetic storage area, i.e. magnetic element, is located in the vertical space between the two wiring planes, i.e. the bit line and word line planes, arranged in an orthogonal pattern. Information is stored by the vector sum of the magnetic fields generated by an energized bit line and word line. These magnetic fields are perpendicular to each other. Assuming the currents are equal and produce a magnetic field having a unit value (1) strength, the resulting magnetic field is equal to the vector sum of the two fields. From the mathematical viewpoint, the resulting magnetic field is equal to 1.414 times the strength of the field generated by the current in one of the lines or conductors, and the resulting magnetic field has a line of force at 45 degrees to each line. If the direction of current flow in these conductors are reversed, then the line of force is at 180 degrees from the first case. As such, the easy axis of magnetization of the magnetic element intersects the point at which the orthogonal bit and word lines cross, and extends at an approximately 45 degree angle to each line.

Although it was assumed that the field in the storage area generated by both the current in the word and bit line are equal, the bit line is closer than the word line to the storage device in the structure of a simple magnetic tunnel junction (MTJ) device. Therefore a slightly higher field is generated by the bit line if the current in the word and bit line are equal.

The current in the selected bit line and in the selected word line generates a magnetic field of a magnitude equal to a unit value (1) at right angles to each cell it traverses. Half-select errors occur when the magnetic field is sufficient to write data to a magnetic storage element. The resulting magnetic field generated by the sum of the currents in the bit line and the word line must be sufficient to write the most difficult magnetic storage element. If the easiest element can be written by a field of less than approximately fifty percent of that needed to write the most difficult element, then the easiest element will be written by the field generated by the current flowing in one conductor, i.e. either through the bit line or the word line alone when another cell along the bit line or word line is being written. To prevent half-select errors in a situation in which the magnetic fields generated by the current in the bit lines and the word lines are equal, each storage element is fabricated so as not to be significantly less than 50 percent different from any other. In the situation in which the magnetic fields are not equal because, for example, the bit line is closer than the word line, there is less margin for error in the fabrication of the storage element. For example, if 70% of the motive force for writing a storage element is attributed to current in one of the lines, then the margin of error is less than 30%. Otherwise, the current in the line that provides 70% of the motive force produces a sufficient magnetic field to write to the cell unintentionally. As such, great care in photo-processing film deposition and composition must be achieved.

Therefore, there is a need in the art to provide a system and method that overcomes the half- write problems for magnetic memory elements.

SUMMARY OF THE INVENTION

The above mentioned problems are addressed by the present subject matter and will be understood by reading and studying the following specification. The present subject matter provides three terminal magnetic random access memory structures and methods. A word line, bit line and select line that traverse a given bit are energized to access the given bit. A significantly increased margin of safety or tolerance for the difference in magnetic susceptibility of the individual bit positions is achieved by energizing three lines rather than two lines. Thus, the probability of half-select errors is significantly diminished.

One aspect of the present subject matter is a memory cell. One embodiment of the memory cell includes a first conductor line, a second conductor line, a third conductor line, and a magnetic storage element. The magnetic storage element is operably positioned to be magnetically coupled to a first magnetic field produced by an energized first conductor line, to a second magnetic field produced by an energized second conductor line, and to a third magnetic field produced by an energized third conductor line. The magnetic storage element is adapted to be written by a vector sum of the first magnetic field, the second magnetic field, and the third magnetic field.

One aspect of the present subject matter is a method for writing to a magnetic storage device. According to one embodiment of this method, a first magnetic field vector, a second magnetic field vector and a third magnetic field vector are formed at the magnetic storage device. The magnetic storage device is written by a vector sum of the first magnetic field vector, the second magnetic field vector and the third magnetic field vector.

One aspect of the present subject matter provides a method for writing to a magnetic storage device. According to one embodiment of this method, a word line is energized to generate a first magnetic field vector through the magnetic storage device, a bit line is energized to generate a second magnetic field vector through the magnetic storage device, and a select line is energized to generate a third magnetic field vector through the magnetic storage device.

These and other aspects, embodiments, advantages, and features will become apparent from the following description of the invention and the referenced drawings.

BRIEF DESCRIPTION OF THE DRAWINGS

FIG. 6 is an illustration of the magnetic field around a conductor resulting from current flowing into the page.

FIG. 7 is an illustration of the magnetic field around a conductor resulting from current flowing out from the page.

FIG. 8 is an illustration of the magnetic field around a conductor resulting from current flowing left.

FIG. 9 is an illustration of the magnetic field around a conductor resulting from current flowing right.

FIG. 16 is a top view of a conventional TMR cross point array of FIG. 1, and illustrates the magnetic moment of the magnetic storage elements in the array.

FIG. 17 is a top view of the TMR cross point array of FIG. 16, and illustrates the application of only a word line current.

FIG. 18 illustrates a maximum magnetic moment vector for a magnetic storage element, the magnetic field vector associated with the current from the word line, and the projection of the magnetic field vector onto the easy axis of magnetization for the storage element.

FIG. 19 is a top view of the TMR cross point array of FIG. 16, and illustrates the application of only a bit line current.

FIG. 20 illustrates a maximum magnetic moment vector for a magnetic storage element, the magnetic field associated with the current from the bit line, and the projection of the magnetic field vector onto the easy axis of magnetization for the storage element.

FIG. 21 is a top view of the TMR cross point array of FIG. 16, and illustrates the application of a word line current and a bit line current.

FIG. 22 illustrates the magnetic fields associated with the current from the word line and the bit line, the vector sum of the magnetic fields projected on the easy axis of magnetization sufficient to overcome the magnetic moment vector for the storage element.

DETAILED DESCRIPTION OF THE INVENTION

Figure 1:
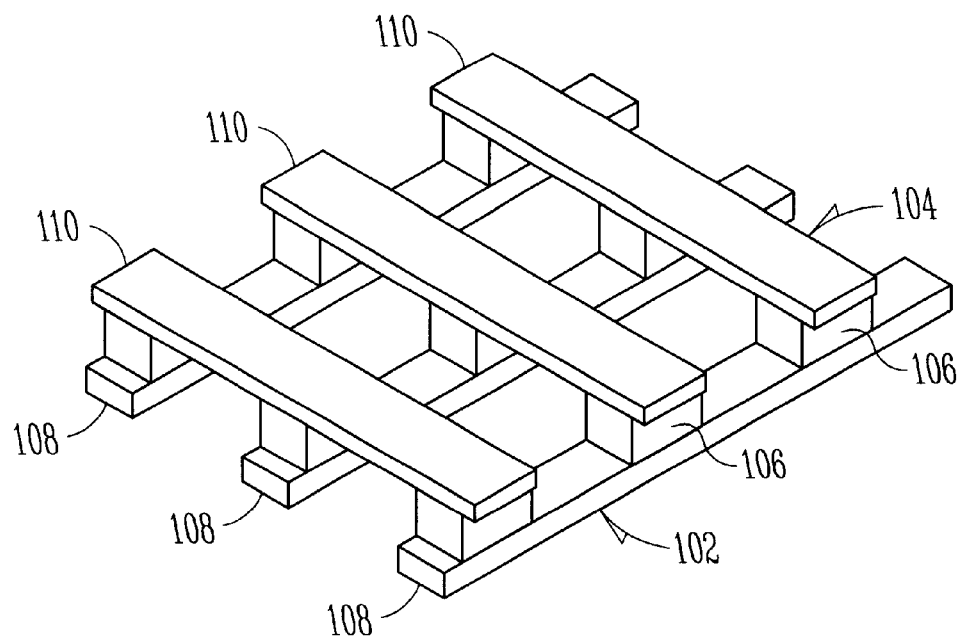
FIG. 1 is an illustration of a conventional TMR cross point array for a conventional MRAM.

The following detailed description of the invention refers to the accompanying drawings which show, by way of illustration, specific aspects and embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

The present subject matter provides a memory cell device which uses three lines to select a desired storage node rather than two lines, i.e. column and row, as are used in the traditional DRAM. According to one embodiment, the three lines are positioned at 60 degree angles to each other. These lines are designated herein as a word line, a bit line and a select line. To access a given bit position, the word line, bit line and select line traversing the given bit are energized. A significantly increased margin of safety or tolerance for differences in the magnetic susceptibility of the individual bit positions is achieved by incorporating a third line, thus alleviating the half-select problem associated with conventional MRAMs.

FIG. 1 is an illustration of a conventional cross point array for a conventional MRAM. The cross point array 100 includes a first wiring layer 102, a second wiring layer 104, and magnetic storage elements 106 stored between the first wiring layer 102 and second wiring layer 104. The second wiring layer 104 is approximately parallel 102 to the first wiring layer. The illustrated first wiring layer 102 includes a plurality of parallel or approximately parallel word lines 108. The second wiring layer 104 includes a plurality of parallel or approximately parallel bit lines 110. The bit lines 110 are orthogonal or approximately orthogonal, albeit in a different plane, to the word lines 108, as is evident in the illustration of FIG. 2.

Figure 2:
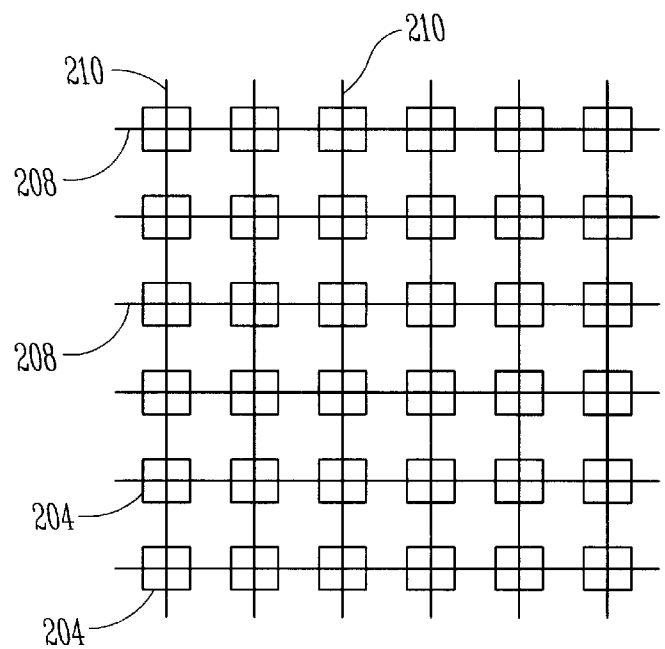
FIG. 2 is a top view of the TMR cross point array of FIG. 1.

FIG. 2 is a top view of the cross point array of FIG. 1. The parallel word lines 208 and the parallel bit lines 210 are orthogonal to each other and cross at intersections in the cross point array. A magnetic storage element 204 is positioned at each intersection, and is selected using the corresponding word line 208 and bit line 210.

Figure 3:
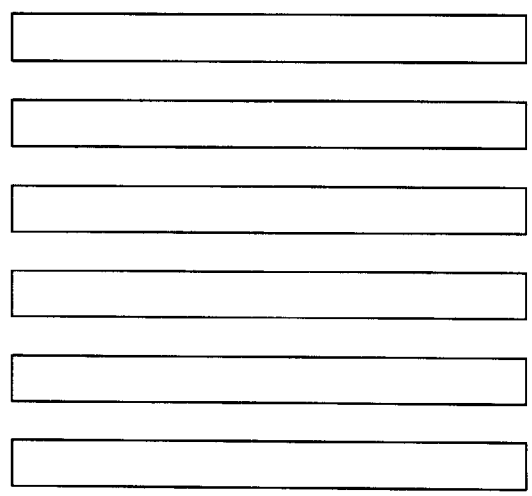
FIG. 3 is a top view of a word line layer in the TMR cross point array of FIG. 1.
Figure 4:
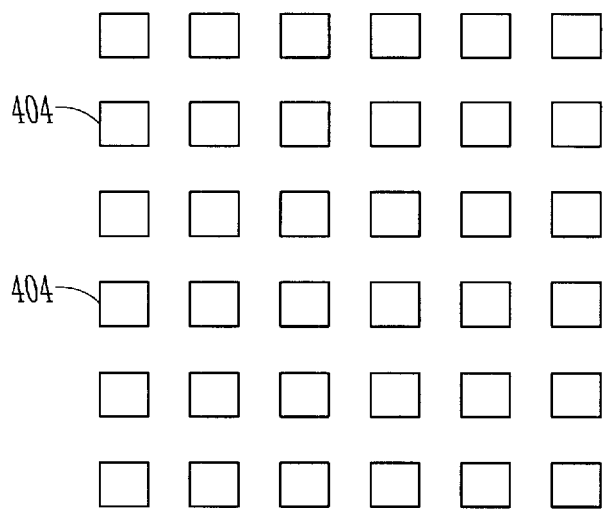
FIG. 4 is a top view of a magnetic storage element layer in the TMR cross point array of FIG. 1.
Figure 5:
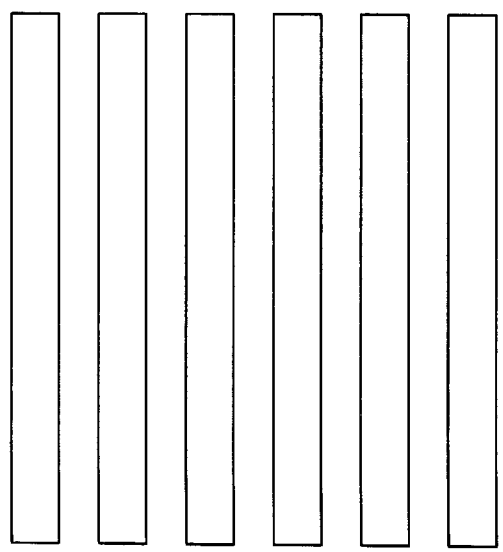
FIG. 5 is a top view of a bit line layer in the TMR cross point array of FIG. 1.

FIGS. 3, 4 and 5 illustrate the layers of the cross point array of FIG. 1. FIG. 3 is a top view of a word line layer 302 in the cross point array of FIG. 1, FIG. 4 is a top view of a layer of magnetic storage elements 404 in the TMR cross point array of FIG. 1, and FIG. 5 is a top view of a bit line layer 506 in the TMR cross point array of FIG. 1. The magnetic storage element layer include a predetermined pattern or layout of storage elements that correspond to the intersection between the word lines and the bit lines.

FIGS. 6–9 illustrate the relationship between the current and magnetic field, and further introduces conventional symbols used to represent this relationship. FIG. 6 is an illustration of the magnetic field around a cross-section of a conductor 612 resulting from current flowing into the page. The direction of the current is represented by the symbol ⊕, which conventionally represents the tail of an arrow pointing into the page. The magnetic field lines, conventionally represented by the nomenclature B, form concentric lines around the conductor or wire 612. The magnitude of B is stronger closer to the conductor 612. The direction for the lines of B is obtained by the Right Hand Rule, which provides that if the conductor 612 is grabbed with the right hand with the thumb pointing in the direction of the current, the fingers will curl around the conductor in the direction of B. In the illustration of FIG. 6 in which the current is flowing into the page, the direction for the lines of B is clockwise around the conductor 612.

FIG. 7 is an illustration of the magnetic field around a cross-section of a conductor resulting from current flowing out from the page. The direction of the current is represented by the symbol ⊙, which conventionally represents the point or head of the arrow pointing out of the page. The magnetic field lines B form concentric lines around the conductor 712. The direction for the lines of B is obtained by the Right Hand Rule. In the illustration of FIG. 7 in which the current is flowing out of the page, the direction for the lines of B is counterclockwise around the conductor 712.

FIG. 8 is an illustration of the magnetic field around a conductor resulting from current flowing left along the conductor. Again the magnetic field lines B form concentric lines around the conductor 812. A cross section of the lines of B is represented by the symbols ⊕ and ⊙, wherein the symbol ⊕ indicates that B is directed into the page, and the symbol ⊙ indicates that B is directed out of the page. In the illustration of FIG. 8 in which the current is flowing left, the direction for the lines of B is into the page above the conductor 812 and out of the page below the conductor 812.

FIG. 9 is an illustration of the magnetic field around a conductor resulting from current flowing right. When the current is flowing right, the direction for the lines of B is into the page below the conductor 912 and out of the page above the conductor 912.

Figure 10:
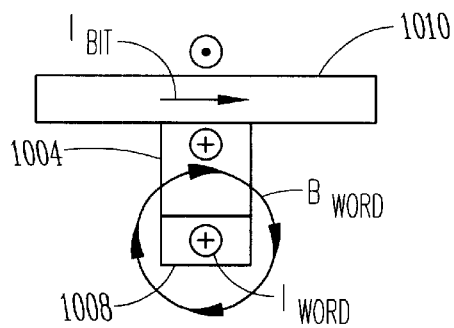
FIG. 10 is a side view of a memory cell in the conventional TMR cross point array of FIG. 1, and illustrates the magnetic fields associated with a bit line current ($I_{BIT}$) flowing right and a word line current ($I_{WORD}$) flowing into the page.

FIG. 10 is a side view of a memory cell in the conventional TMR cross point array of FIG. 1, and illustrates the magnetic fields associated with a bit line current ($I_{BIT}$) flowing right and a word line current ($I_{WORD}$) flowing into the page. A bit line 1010, a word line 1008 and a magnetic storage element 1004 are shown. The magnetic field resulting from the bit line current $I_{BIT}$ is represented by the nomenclature $B_{BIT}$, and the magnetic field resulting from word line current $I_{WORD}$ is represented by the nomenclature $B_{WORD}$. At the magnetic storage element 1004, the lines of $B_{WORD}$ are directed toward the right and the lines of $B_{BIT}$ are directed into the page.

Figure 11:
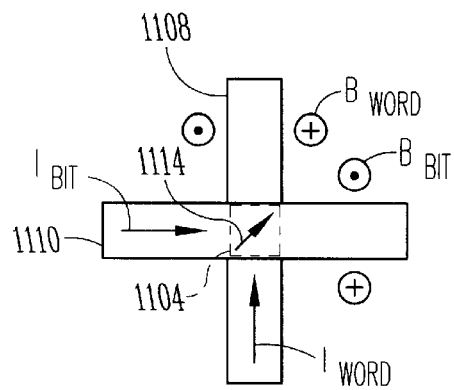
FIG. 11 is a top view of the memory cell of FIG. 10.

FIG. 11 is a top view of the memory cell of FIG. 10. The lines of $B_{BIT}$ at the magnetic storage element 1104, which is illustrated below the bit line conductor 1110, are directed toward the top of the page, and the lines of $B_{WORD}$ at the magnetic storage element 1104, which is illustrated above the word line conductor 1108, are directed toward the right.

The resultant magnetic field vector provided by the vector sum of $B_{BIT}$ and $B_{WORD}$ is oriented in the direction provided by the arrow at 1114.

Figure 12:
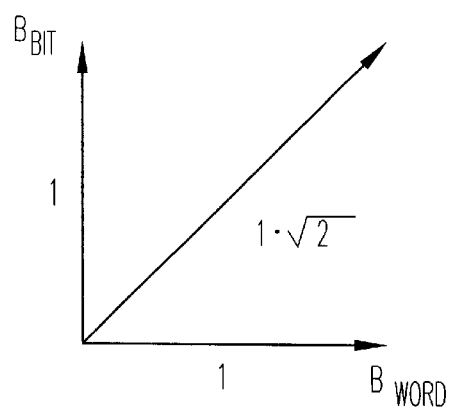
FIG. 12 illustrates the vector sum of the perpendicular magnetic fields associated with the bit line current flow and word line current flow illustrated in FIG. 10.

FIG. 12 illustrates the vector sum of the perpendicular magnetic fields associated with the bit line current flow $I_{BIT}$ and word line current flow $I_{WORD}$ illustrated in FIG. 10 and FIG. 11. The magnetic fields $B_{BIT}$ and $B_{WORD}$ are perpendicular because the bit line conductors and word line conductors are arranged orthogonally. The magnitude of each of these fields $B_{BIT}$ and $B_{WORD}$ at the magnetic storage element is assumed to be a unit value. The resultant magnetic field vector provided by the vector sum of $B_{BIT}$ and $B_{WORD}$ has a magnitude provided by the following equation:

$$B_{RESULTANT} = \sqrt{B_{BIT}^2 + B_{WORD}^2} = \sqrt{2} = 1.414.$$

The resultant magnetic field vector has a direction provided by the following equation:

$$\tan O = \frac{B_{BIT}}{B_{WORD}} = 1; \quad O = 45°.$$

Figure 13:
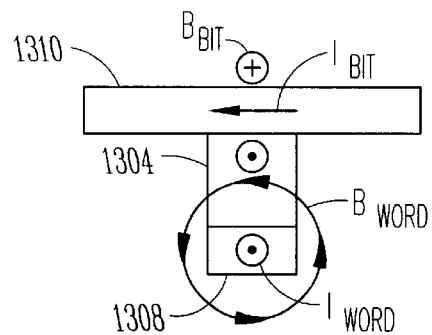
FIG. 13 is a side view of a memory cell in the conventional TMR cross point array of FIG. 1, and illustrates the magnetic fields associated with a bit line current ($I_{BIT}$) flowing left and a word line current ($I_{WORD}$) flowing out from the page.

FIG. 13 is a side view of a memory cell in the conventional cross point array of FIG. 1, and illustrates the magnetic fields associated with a bit line current ($I_{BIT}$) flowing left and a word line current ($I_{WORD}$) flowing out from the page. A bit line 1310, a word line 1308 and a magnetic storage element 1304 are shown. At the magnetic storage element 1304, the lines of $B_{WORD}$ are directed toward the left and the lines of $B_{BIT}$ are directed out of the page.

Figure 14:
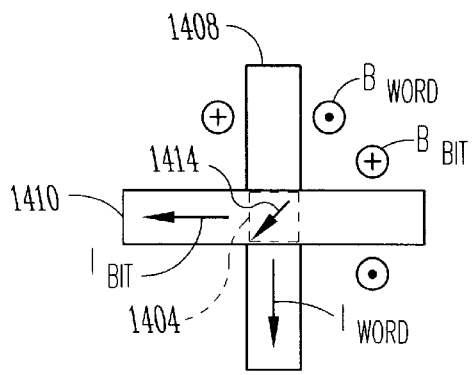
FIG. 14 is a top view of the memory cell of FIG. 13.

FIG. 14 is a top view of the memory cell of FIG. 13. The lines of $B_{BIT}$ at the magnetic storage element 1404, which is illustrated below the bit line conductor 1410, are directed toward the bottom of the page, and the lines of $B_{WORD}$ at the magnetic storage element 1404, which is illustrate above the word line conductor 1408, are directed toward the left. The resultant magnetic field vector provided by the vector sum of $B_{BIT}$ and $B_{WORD}$ is oriented in the direction provided by the arrow at 1414.

Figure 15:
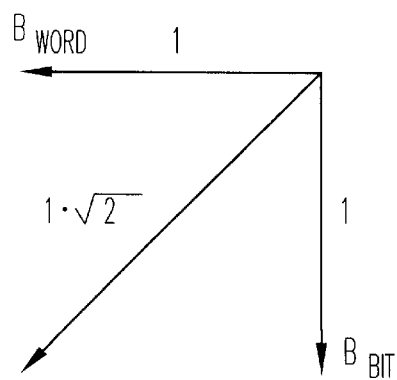
FIG. 15 illustrates the vector sum of the perpendicular magnetic fields associated with the bit line current flow and the word line current flow illustrated in FIG. 13.

FIG. 15 illustrates the vector sum of the perpendicular magnetic fields associated with the bit line current flow and the word line current flow illustrated in FIG. 13 and FIG. 14. The magnitude of the fields $B_{BIT}$ and $B_{WORD}$ at the magnetic storage element is assumed to be a unit value. The resultant magnetic field vector provided by the vector sum of $B_{BIT}$ and $B_{WORD}$ has a magnitude of 1.414 and a direction θ of 45 degrees.

The magnetic element has a magnetic moment and is characterized by a predominant or easy axis of magnetization. In the absence of an external magnetic field, the magnetic moment is oriented along the easy axis of magnetization in one of two stable states. In magnetoresistance technology, one of the stable states for the magnetic moment of the magnetic element is a high resistance state and the other of the stable states is a low resistance state.

FIG. 16 is a top view of a conventional cross point array of FIG. 1, and illustrates the magnetic moment of the magnetic storage elements in the array. No current is flowing through any of the bit line conductors 1610 or the word line conductors 1608, and so no external magnetic field exists. The magnetic moment of each of the magnetic storage elements 1604 is in one of the stable states along the easy axis of magnetization. The easy axis of magnetization is illustrated to be aligned at an angle of 45 degrees with respect to bit line conductors and the word line conductors, but is not required to be so aligned. The vector sum of unit values for $B_{BIT}$ and $B_{WORD}$ produce a $B_{RESULTANT}$ that is aligned with the easy axis of magnetization.

FIG. 17 is a top view of the cross point array of FIG. 16, and illustrates the application of only a word line current. As illustrated in FIG. 18, this single word line current is not sufficient to write to a desired magnetic storage element 1704 in FIG. 17. FIG. 18 illustrates a maximum magnetic moment vector 1816 for a magnetic storage element, the magnetic field vector $B_{WORD}$ associated with the word line $I_{WORD}$, and the projection 1818 of the magnetic field vector onto the easy axis of magnetization 1820 for the storage element. The maximum magnetic moment vector for a magnetic storage element is equal to the vector sum of $B_{WORD}$ and $B_{BIT}$, or 1.414 for unit values for $B_{WORD}$ and $B_{BIT}$. The magnetic moment vector for a magnetic storage element typically will not be the maximum (i.e. 1.414) but rather will often be a lesser value, such as the unit value 1. The projection of the magnetic field vector onto the easy axis of magnetization represents the motive force of $B_{WORD}$ to move the magnetic moment, and is provided by:

$$|B_{WORD}| \times \cos \theta = \cos(45°) = 0.707.$$

Thus, application of only the word line current $I_{WORD}$ produces a $B_{WORD}$ with a motive force of 70% of the unit value of the $B_{WORD}$. For a magnetic storage element that has a maximum magnetic moment vector (1.414), the application of only $I_{WORD}$ provides only about 50% of the required motive force. For a magnetic storage element that has a magnetic moment vector of 1, the application of only $I^{WORD}$ provides only about 70% of the required motive force.

FIG. 19 is a top view of the cross point array of FIG. 16, and illustrates the application of only a bit line current $I_{BIT}$. As illustrated in FIG. 20, this single word line current is not sufficient to write to a desired magnetic storage element 1904 in FIG. 19.

FIG. 20 illustrates a maximum magnetic moment vector 2016 for a magnetic storage element, the magnetic field associated with the bit line current $I_{BIT}$, and the projection 2018 of the magnetic field vector onto the easy axis of magnetization 2020 for the storage element. The projection of the magnetic field vector onto the easy axis of magnetization represents the motive force of $B_{BIT}$ to move the magnetic moment, and is 70% of the unit value of $B_{BIT}$. For a magnetic storage element that has a maximum magnetic moment vector (1.414), the application of only $I_{BIT}$ provides only about 50% of the required motive force. For a magnetic storage element that has a magnetic moment vector of 1, the application of only $I_{BIT}$ provides only about 70% of the required motive force.

FIG. 21 is a top view of the cross point array of FIG. 16, and illustrates the application of a word line current $I_{WORD}$ and a bit line current $I^{BIT}$. As illustrated in FIG. 22, the application of $I_{WORD}$ and $I_{BIT}$ is sufficient to write to a desired magnetic storage element 2104 in FIG. 21.

FIG. 22 illustrates the magnetic fields associated with the word line current $I_{WORD}$ and the bit line current $I_{BIT}$, and illustrates that the vector sum of the magnetic fields $B_{WORD}$ and $B_{BIT}$ projected on the easy axis of magnetization sufficient 2220 to overcome the maximum magnetic moment vector for the storage element and move the magnetic moment from a first stable state to a second stable state. When the external fields $B_{WORD}$ and $B_{BIT}$ are removed by removing $I_{WORD}$ and $I_{BIT}$, the magnetic moment of the magnetic storage element remains in the second stable state along its axis of easy magnetization.

Figure 23:
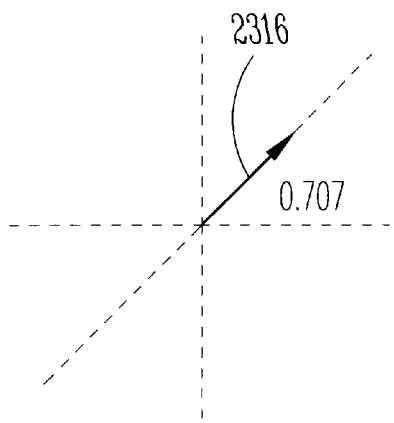
FIG. 23 illustrates the magnetic moment vector for a storage element that is half of the maximum magnetic moment vector.

FIG. 23 illustrates the magnetic moment vector for a storage element that is about 50% of the maximum magnetic moment vector (1.414), or about 70% of a unit magnetic moment vector (1). Referring to FIG. 21, if the storage element 2136, which is not intended to be written, is fabricated with a small magnetic moment vector, then the application of the only $I_{WORD}$ is sufficient for the magnetic moment vector to change states.

Figure 24:
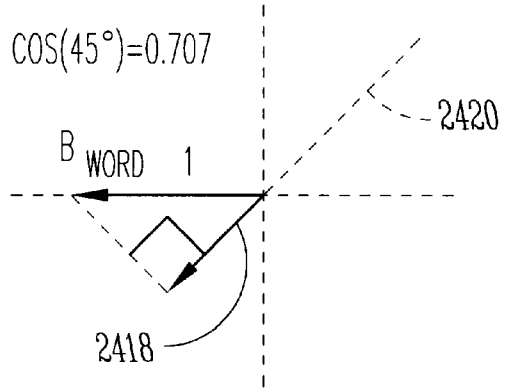
FIG. 24 illustrates the magnetic field vector associated with the current from the word line, and the projection of the magnetic field vector onto an easy axis of magnetization that is sufficient to overcome the smaller magnetic moment vector.

FIG. 24 illustrates the magnetic field vector $B_{WORD}$ associated with the word line current $I_{WORD}$, and the projection 2418 of the magnetic field vector $B_{WORD}$ onto an easy axis of magnetization 2420 that is sufficient to overcome the smaller magnetic moment vector. The value of the projection of unit value $B_{WORD}$ onto the easy axis of magnetization is 0.707. This is sufficient to move the magnetic moment from the first stable state to the second stable state. Thus, the storage element is unintentionally written. This is referred to as the half-select error.

Figure 25:
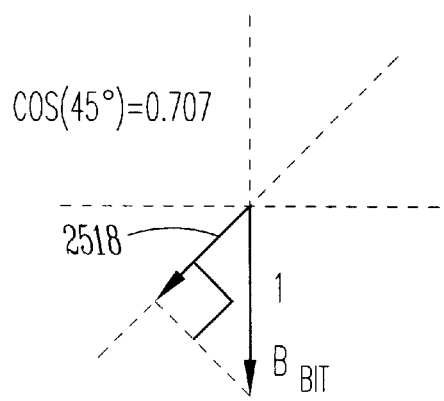
FIG. 25 illustrates the magnetic field vector associated with the current from the bit line, and the projection of the magnetic field vector on an easy axis of magnetization that is sufficient to overcome the smaller magnetic moment vector.

FIG. 25 illustrates the magnetic field vector $B_{BIT}$ associated with the bit line current $I_{BIT}$, and the projection 2518 of the magnetic field vector $B_{BIT}$ on an easy axis of magnetization 2520 that is sufficient to overcome the smaller magnetic moment vector. The value of the projection of unit value $B_{BIT}$ onto the easy axis of magnetization also is 0.707, and is sufficient to move the magnetic moment from the first stable state to the second stable state.

Figure 26:
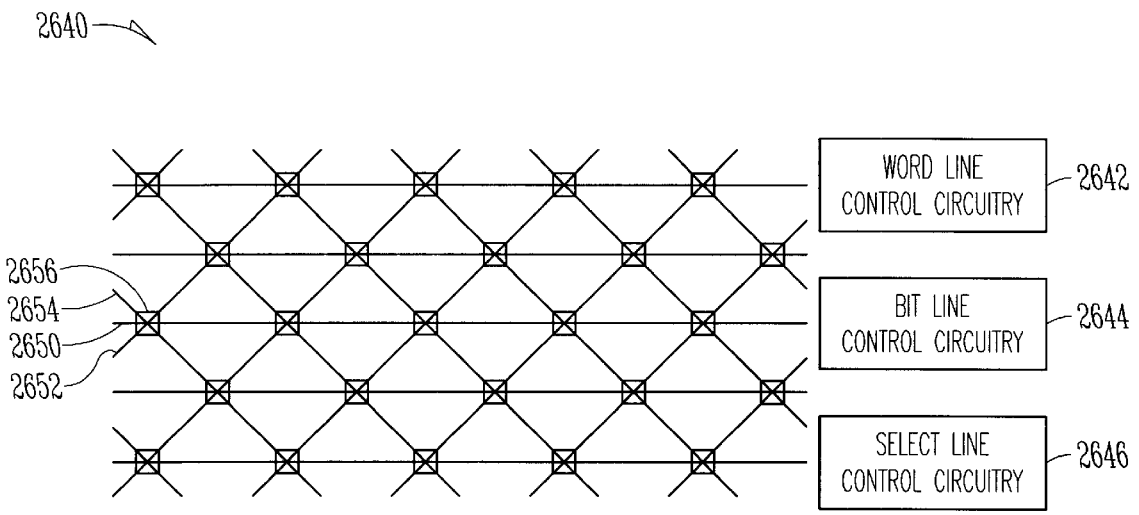
FIG. 26 illustrates a MRAM according to the present invention with magnetic memory cells located at intersections among bit lines, word lines and select lines in a cross point array.

FIG. 26 illustrates a MRAM according to the present invention with magnetic memory cells or storage devices located at intersections among bit lines, word lines and select lines in a cross point array. The illustrated MRAM 2640 includes Word Line Control Circuitry 2642, Bit Line Control Circuitry 2644, and Select Line Control Circuitry. 2646 These control circuits control the current direction and magnitude on the conductors, cooperate with each other to write to a desired magnetic storage device by providing the appropriate current to a word line conductor 2650, a bit line conductor 2652, and a select line conductor 2654 that corresponds to the desired magnetic storage device 2656. The magnetic storage device is capable of being magnetically coupled to a magnetic field generated by current in the word line, bit line and select line conductors. According to one embodiment, the word line conductors are oriented at an angle of approximately 60 degrees with the bit line conductors and the select line conductors, and the bit line conductors are oriented at an angle of approximately 60 degrees with the select line conductors. The MRAM 2640 is characterized as a three terminal MRAM, as it includes requires a terminal to control the word line conductors 2650, a terminal to control the bit line conductors 2652, and a terminal to control the select line conductors 2654. All three conductors are energized to write to a desired memory cell 2656.

Figure 27:
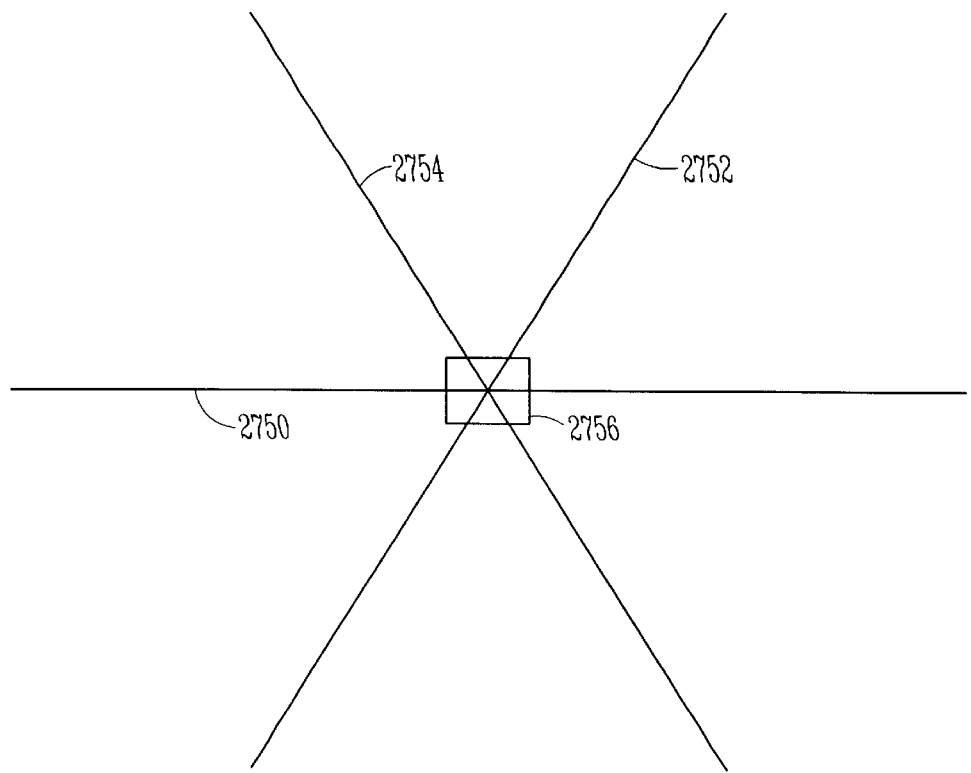
FIG. 27 illustrates an intersection in the cross point array in more detail.

FIG. 27 illustrates an intersection in the cross point array in more detail. This intersection represents a memory cell, and includes a magnetic storage element 2756, a word line conductor 2750, a bit line conductor 2752, and a select line conductor 2754.

Figure 28:
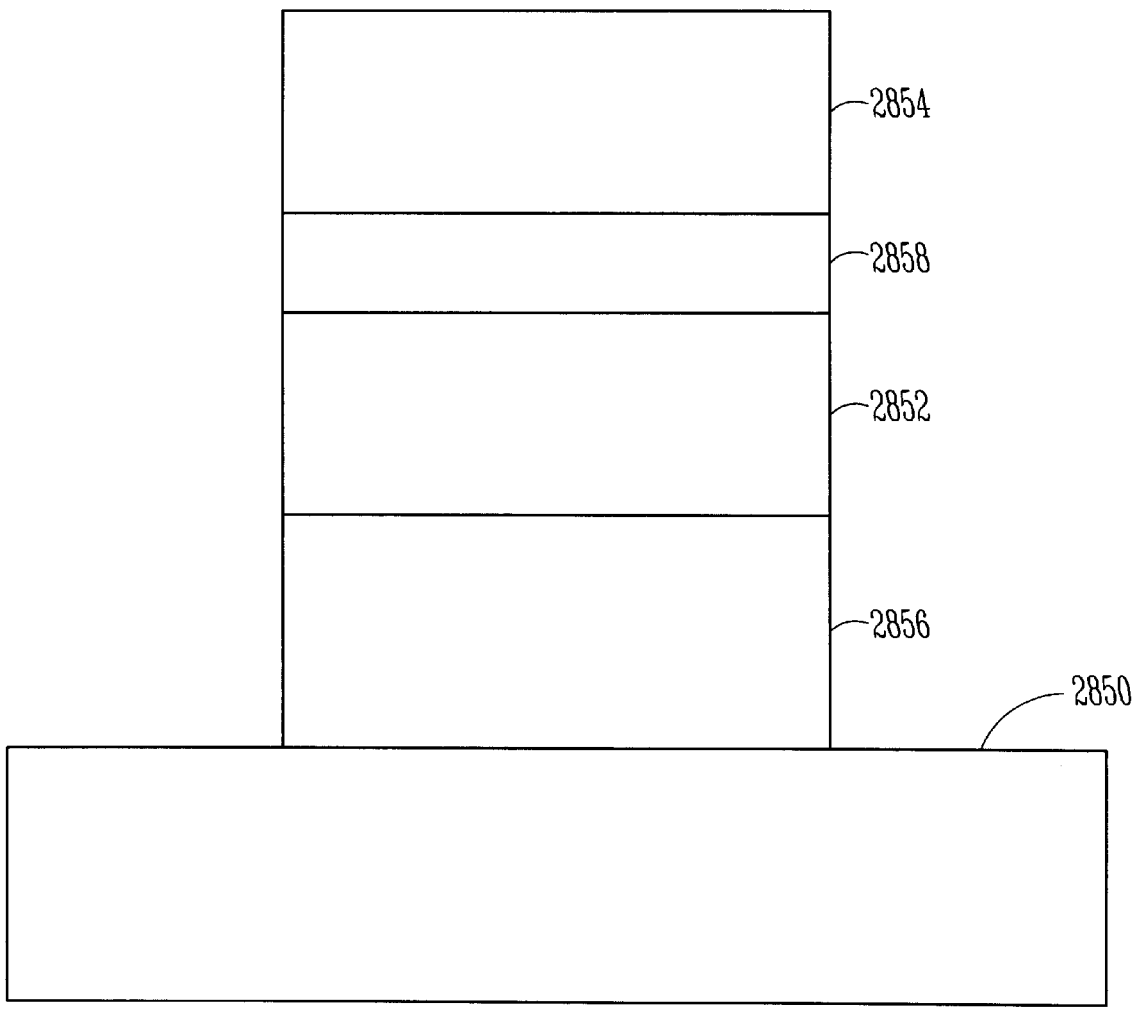
FIG. 28 illustrates a structure for one embodiment of the cross point array of FIG. 26.

FIG. 28 illustrates a structure for one embodiment of the cross point array of FIG. 26. In this embodiment, a magnetic storage element 2856 is interposed between a bit line 2852 and a word line 2850 at each intersection. A select line 2854 also passes operably close to the magnetic storage element 2856 at the intersection. According to one embodiment, the array is fabricated by forming or otherwise providing a word line layer, a storage element layer on the word line layer, a bit line layer on the storage element layer, an insulator layer 2858 on the bit line layer, and a select line layer on the insulator layer. The magnetic storage element is capable of being magnetically coupled by a magnetic field generated by a current in each of these layers. According to one embodiment, the magnetic storage element is a magnetoresistance device, and is electrically coupled to the word line and the bit line.

Figure 29:
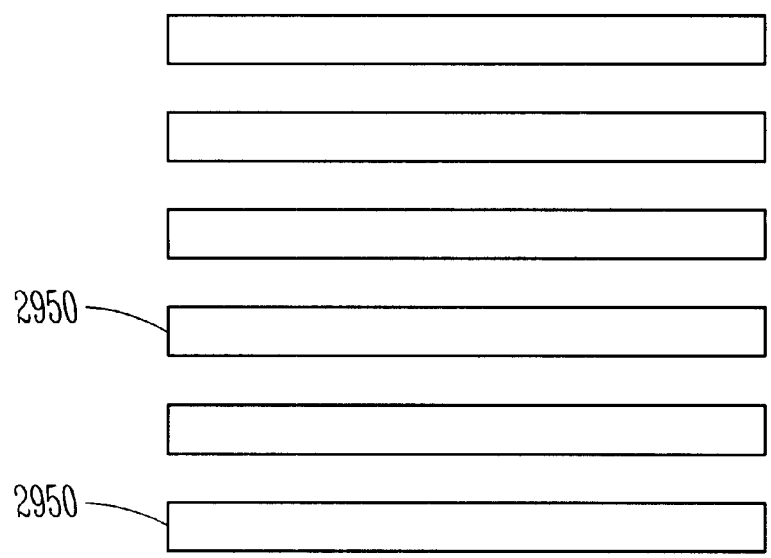
FIG. 29 is a top view of a word line layer in the cross point array of FIG. 26.

FIG. 29 is a top view of a word line layer in the cross point array of FIG. 26. The word line layer includes a set of parallel, or approximately parallel, word line conductors 2950.

Figure 30:
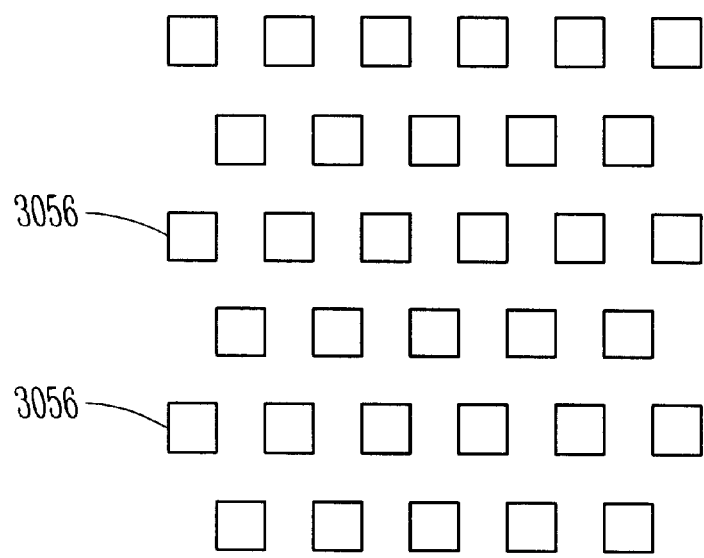
FIG. 30 is a top view of a magnetic storage element layer in the cross point array of FIG. 26.

FIG. 30 is a top view of a magnetic storage element layer in the cross point array of FIG. 26. The magnetic storage element layer includes a pattern of magnetic storage elements 2956. The pattern is determined such that the magnetic storage elements will be at or operably close to an intersection of word, bit and select line conductors.

Figure 31:
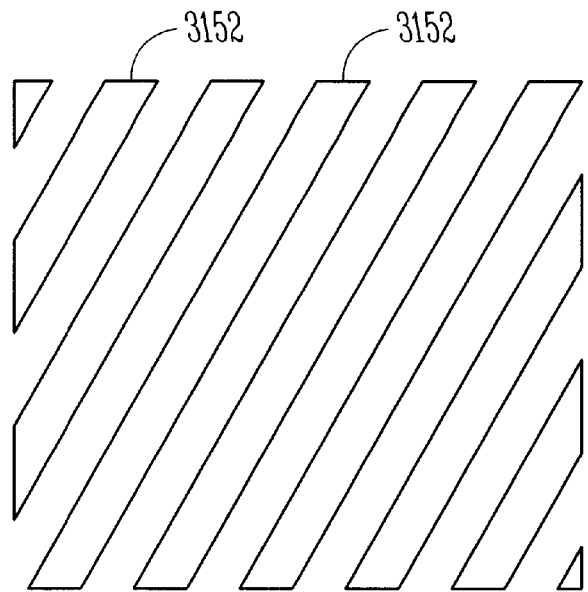
FIG. 31 is a top view of a bit line layer in the cross point array of FIG. 26.

FIG. 31 is a top view of a bit line layer in the cross point array of FIG. 26. The bit line layer includes a set of parallel, or approximately parallel, bit line conductors 3152. According to one embodiment, the bit line conductors are oriented to form an angle of approximately 60 degrees with the word line conductors, albeit in a different plane.

Figure 32:
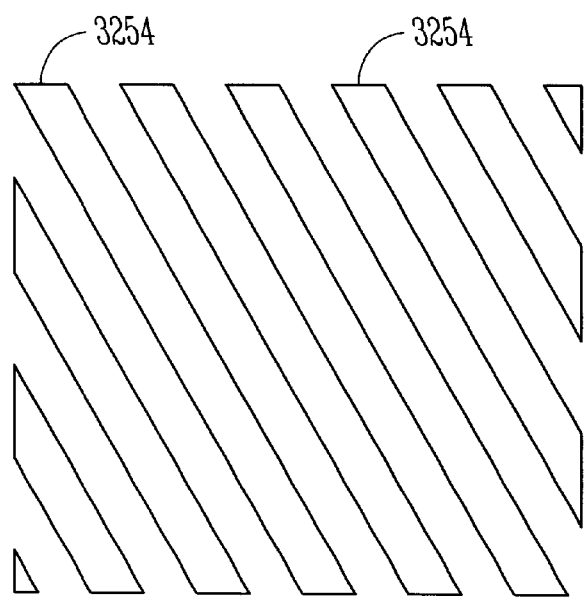
FIG. 32 is a top view of a select line layer in the cross point array of FIG. 26.

FIG. 32 is a top view of a select line layer in the cross point array of FIG. 26. The select line layer includes a set of parallel, or approximately parallel, select line conductors 3254. According to one embodiment, the select line conductors are oriented to form an angle of approximately 60 degrees with the word line conductors and an angle of approximately 60 degrees with the bit line conductors, albeit in a different plane.

Figure 33:
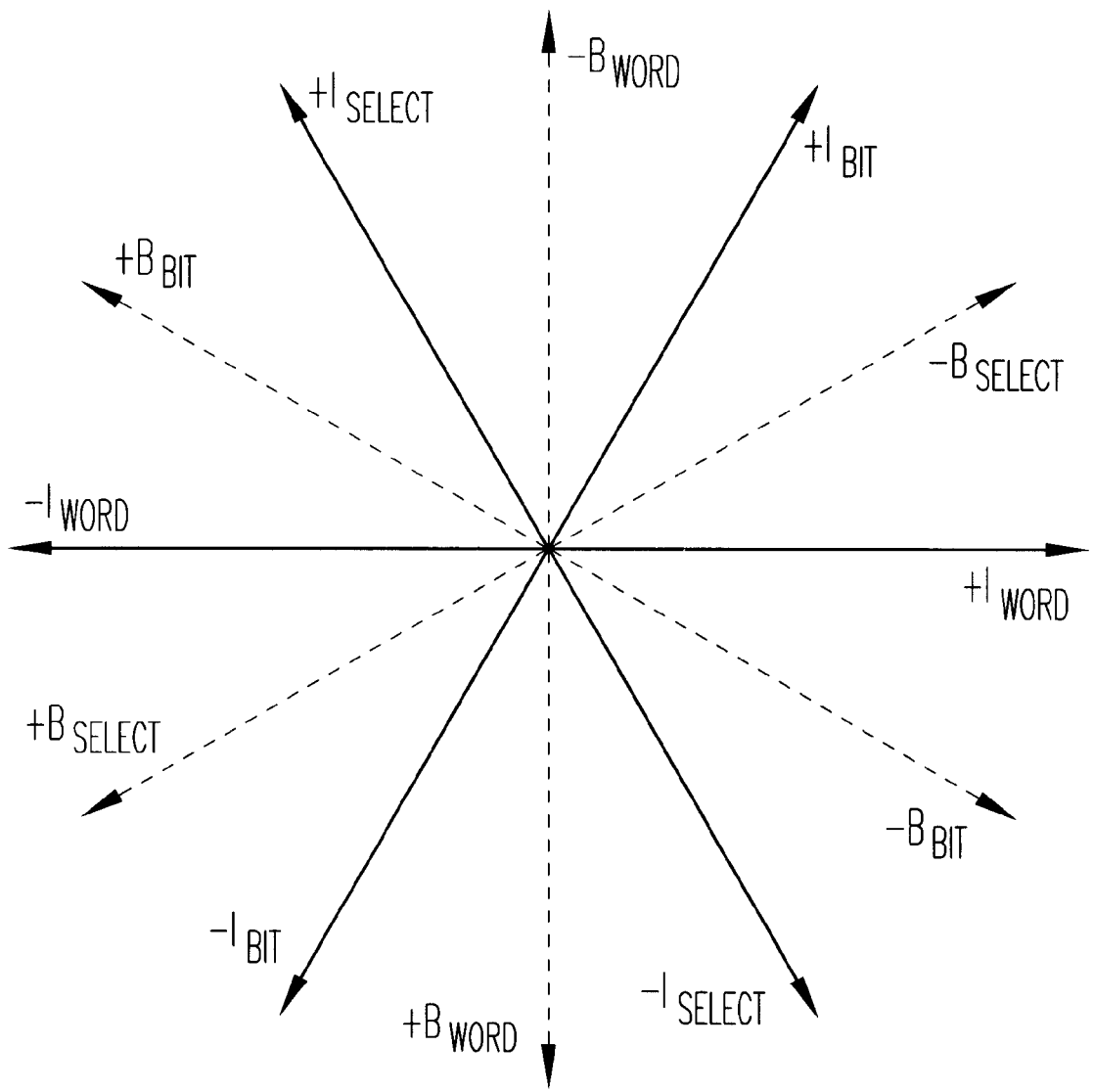
FIG. 33 illustrates the current flow in the word line, the bit line and the select line, and further illustrates the magnetization fields at the storage element that are associated with the current flow as illustrated for the structure of FIG. 28.

FIG. 33 illustrates vectors for the current flow in the word line, the bit line and the select line, and further illustrates vectors for the magnetic fields at the storage element that are associated with the current flow as illustrated for the structure of FIG. 28. The current flow in the conductors is represented as solid lines, and the corresponding magnetic fields are illustrated as dashed lines. The current vectors have been assigned positive and negative directions. The vector+$I_{WORD}$ represents a word line current in a first direction and the vector $-I_{WORD}$ represents a word line current in the opposite direction. The vectors +$I_{BIT}$, $-I_{BIT}$,+ $I_{SELECT}$, and $-I_{SELECT}$ have been also been identified.

The magnetic fields form concentric circles around the conductors, the direction of which is identified using the Right Hand Rule as described above. The illustrated magnetic field vectors illustrate the vector at the magnetic storage element. The magnetic field vectors are orthogonal to their corresponding current vectors, but whether the value of the vector is positive or negative depends on the position of the conductor with respect to the magnetic storage element. In the example illustrated in FIG. 28, the storage element is positioned above the word line conductors and below the bit line and select line conductors. Therefore, from a top view, +$B_{WORD}$ is oriented 90 degrees clockwise with respect to +$I_{WORD}$, +$B_{BIT}$ is oriented 90 degrees counterclockwise with respect to +$I_{BIT}$, and +$B_{SELECT}$ is oriented 90 degrees counterclockwise with respect to +$I_{SELECT}$.

Figure 34:
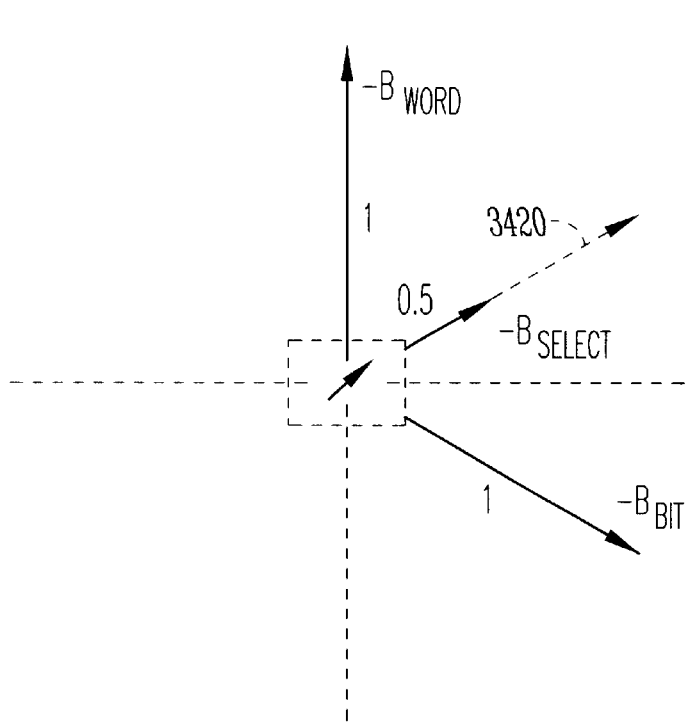
FIG. 34 illustrates the magnetic field vectors associated with the current from the word line, the bit line, and the select line for one embodiment of the cross point array.

FIG. 34 illustrates the magnetic field vectors associated with the current from the word line, the bit line, and the select line for one embodiment of the cross point array. In this example, $-B_{SELECT}$ is oriented along the easy axis of magnetization 3420 for the storage unit, and $-B_{WORD}$ and $-B_{BIT}$ are positioned at an angle of approximately 60 degrees on either side of $-B_{SELECT}$. Additionally, the magnitude of $-B_{WORD}$ is a unit value (1), the magnitude of $-B_{BIT}$ is a unit value, and the magnitude of $-B_{SELECT}$ is half a unit value (0.5) The projections of $-B_{WORD}$ and $-B_{BIT}$ on the easy axis of magnetization 3420 are both equal to the cosine of 60 degrees, which is 0.5.

Figure 35:
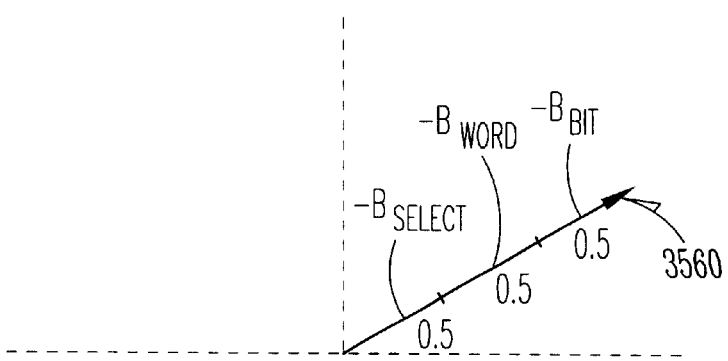
FIG. 35 illustrates the vector sum of the magnetic field vectors of FIG. 34.

FIG. 35 illustrates the vector sum of the magnetic field vectors of FIG. 34. The vector sum is represented by $-B_{SELECT} + -B_{WORD} *\cos(60°) + -B_{BIT} *\cos(60°)$, which equals 0.5+0.5+0.5. Thus, in this example, each of the magnetic field vectors $-B_{SELECT}$, $-B_{WORD}$ and $-B_{BIT}$ equally contribute to the resultant vector 3560. That is, each of the magnetic field vectors contribute to 33% of the resultant vector. In contrast, for the conventional cross point array illustrated in FIG. 2, 50% of the resultant vector is contributed by $B_{WORD}$ and 50% is contributed by $B_{BIT}$.

Figure 36:
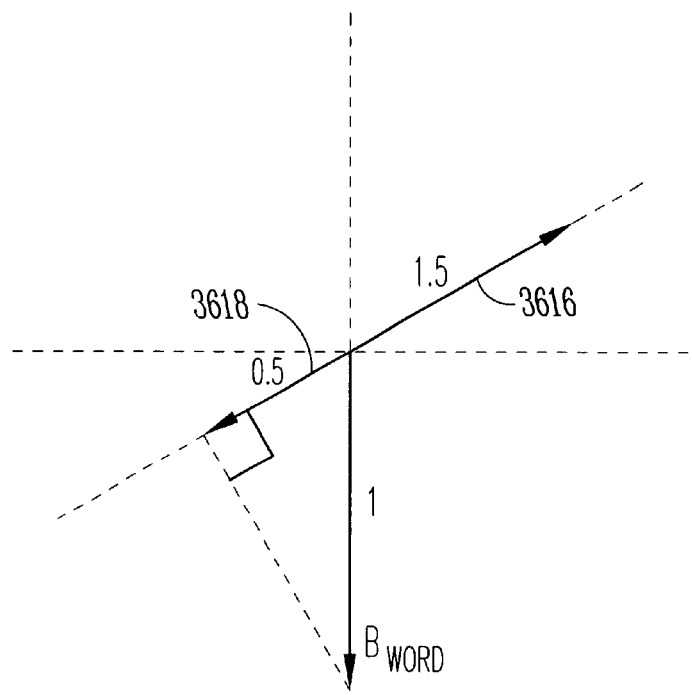
FIG. 36 illustrates a maximum magnetic moment vector for a magnetic storage element, the magnetic field associated with the current from the word line, and the projection of the magnetic field vector onto an easy axis of magnetization.

FIG. 36 illustrates a maximum magnetic moment vector for a magnetic storage element, the magnetic field $B_{WORD}$ associated with the word line current $I_{WORD}$, and the projection of the magnetic field vector onto an easy axis of magnetization. The maximum magnetic moment vector 3616 for a magnetic storage element is equal to the vector sum of $B_{WORD}$, $B_{BIT}$ and $B_{SELECT}$, or 1.5 for unit values for $B_{WORD}$, $B_{BIT}$ and $B_{SELECT}$. The magnetic moment vector for a magnetic storage element typically will not be the maximum (i.e. 1.5) but rather will often be a lesser value, such as the unit value 1. The projection 3618 of the magnetic field vector onto the easy axis of magnetization represents the motive force of $B_{WORD}$ to move the magnetic moment, and is provided by:

$$|B_{WORD}| \times \cos\theta = \cos(60°) = 0.50.$$

Thus, application of only the word line current $I_{WORD}$ produces a $B_{WORD}$ with a motive force of 50% of the unit value of the $B_{WORD}$. For a magnetic storage element that has a maximum magnetic moment vector 3616 with a value of 1.5, the application of only $I_{WORD}$ provides only about 33% of the required motive force. For a magnetic storage element that has a magnetic moment vector of 1, the application of only $I_{WORD}$ provides only about 50% of the required motive force. Advantages are gained because the magnetic storage elements are allowed to have larger fabrication tolerances and because the likelihood of half-select errors are diminished.

Figure 37:
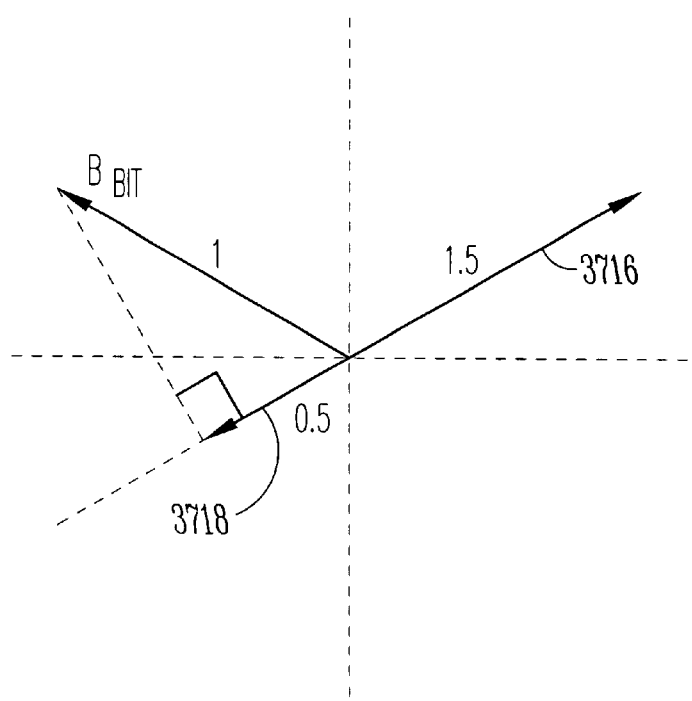
FIG. 37 illustrates a maximum magnetic moment vector for a magnetic storage element, the magnetic field associated with the current from the bit line, and the projection of the magnetic field vector onto an easy axis of magnetization.

FIG. 37 illustrates a maximum magnetic moment vector for a magnetic storage element, the magnetic field associated with the current from the bit line, and the projection of the magnetic field vector onto an easy axis of magnetization. The projection 3718 of the magnetic field vector onto the easy axis of magnetization represents the motive force of $B_{BIT}$ to move the magnetic moment, and is 50% of the unit value of $B_{BIT}$. For a magnetic storage element that has a maximum magnetic moment vector 3716 with a value of 1.5, the application of only $I_{BIT}$ provides only about 33% of the required motive force. For a magnetic storage element that has a magnetic moment vector of 1, the application of only $I_{BIT}$ provides only about 50% of the required motive force. Advantages are gained because the magnetic storage elements are allowed to have larger fabrication tolerances and because the likelihood of half-select errors are diminished.

Figure 38:
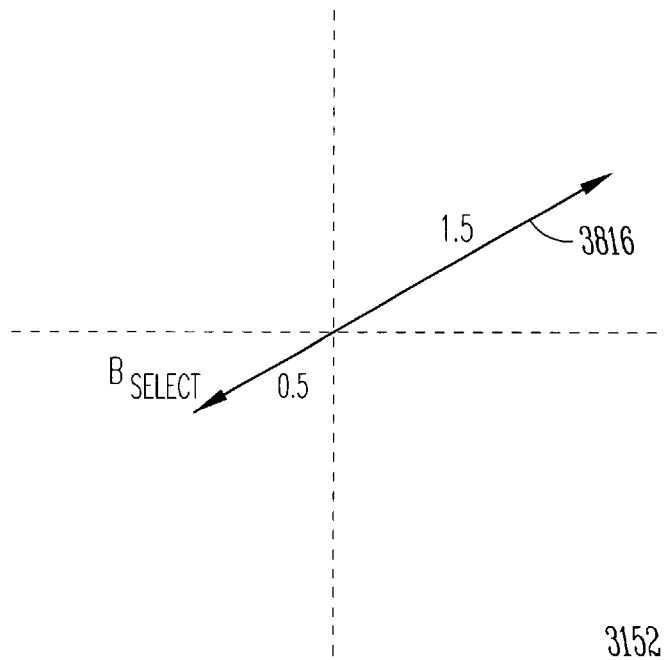
FIG. 38 illustrates a maximum magnetic moment vector for a magnetic storage element, and the magnetic field associated with the current from the select line.

FIG. 38 illustrates a maximum magnetic moment vector for a magnetic storage element, and the magnetic field associated with the current from the select line. $B_{SELECT}$ is already aligned with the easy axis of magnetization, and as such, already represents the motive force of $B_{SELECT}$ to move the magnetic moment. For a magnetic storage element that has a maximum magnetic moment vector 3816 with a value of 1.5, the application of only $I_{BIT}$ provides only about 33% of the required motive force. For a magnetic storage element that has a magnetic moment vector of 1, the application of only $I_{BIT}$ provides only about 50% of the required motive force.

Figure 39:
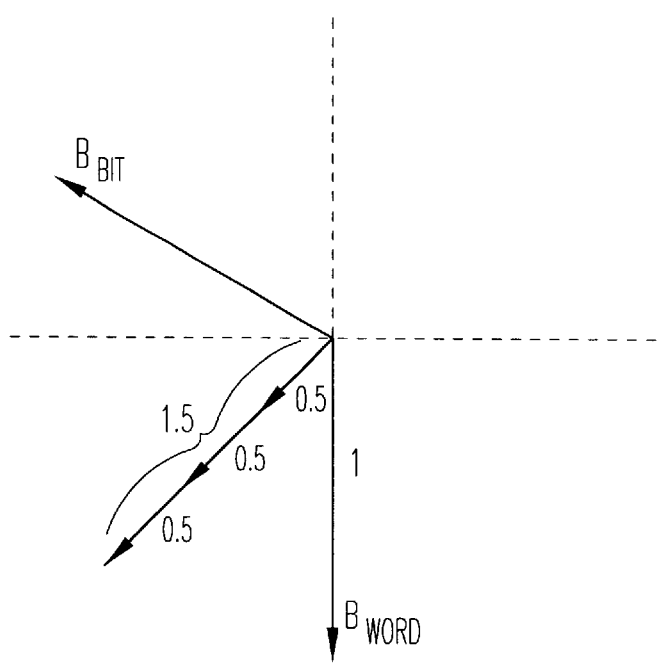
FIG. 39 illustrates the magnetic fields associated with the current from the word line, the bit line, and the select line, and further illustrates the vector sum of the magnetic fields projected on an easy axis of magnetization that is sufficient to overcome the magnetic moment vector for the storage element.

FIG. 39 illustrates the magnetic fields associated with the current from the word line, the bit line, and the select line, and further illustrates the vector sum of the magnetic fields projected on an easy axis of magnetization that is sufficient to overcome the magnetic moment vector for the storage element. When the external fields $B_{WORD}$, $B_{BIT}$ and $B_{SELECT}$ are removed by removing $I_{WORD}$, $I_{BIT}$ and $I_{SELECT}$, the magnetic moment of the magnetic storage element remains in the second stable state along its axis of easy magnetization.

In the example provided above, one of the magnetic fields ($B_{SELECT}$) was oriented to be aligned with the easy axis of magnetization, and had a magnitude of one half of a unit value. The present invention is not limited by this example. Other possibilities exist for magnitude and direction values of these vectors. In one embodiment of the present invention, it is desired for the three magnetic field vectors to have approximately equal projections on the easy axis of magnetization. In this embodiment, each of the projections are equally weighted with respect to the other projections. As one of ordinary skill in the art will understand upon reading and comprehending this disclosure, other combinations of vectors can be used to provide approximately equal projections on the easy axis of magnetization. Additionally, as one of ordinary skill in the art will understand upon reading and comprehending this disclosure, these magnetic field projection vectors are provided by a determined or calculated current in the conductors. The determined value of this current takes into account the distance between the conductors and the magnetic storage element.

Furthermore, as one of ordinary skill in the art will understand upon reading and comprehending this disclosure, the present invention provides desirable benefits even if the three magnetic field vectors do not have approximately equal projections on the easy axis of magnetization. However, in this scenario, the benefits will be limited by the magnetic field that provides the largest projection on the easy axis of magnetization. For example, a magnetic storage element is written to by providing a word line current $I_{WORD}$, a bit line current $I_{BIT}$ and a select line current $I_{SELECT}$. If the magnetic field $B_{WORD}$ associated with a word line current $I_{WORD}$ is largest, those magnetic memory elements coupled to $B_{WORD}$ associated with $I_{WORD}$ are more likely to be accidently written to than the magnetic memory elements coupled to $B_{BIT}$ associated with $I_{BIT}$ or the magnetic memory elements coupled to $B_{SELECT}$ associated with $I_{SELECT}$.

The use of three conductors to select a memory cell in a MRAM allows greater forgiveness with respect to the fabrication tolerances of the magnetic storage elements, and thus also diminishes the likelihood of half-select errors. The maximum magnetic moment for a three terminal MRAM is 1.5 unit values as compared to 1.414 unit values for the conventional cross point memory array. Additionally, the minimum magnetic moment to prevent half-select errors for a three terminal MRAM is approximately 0.5 unit values as compared to 0.707 unit values the conventional cross point memory array. As a result, the three terminal MRAM is less likely to incur half-select errors.

Figure 40:
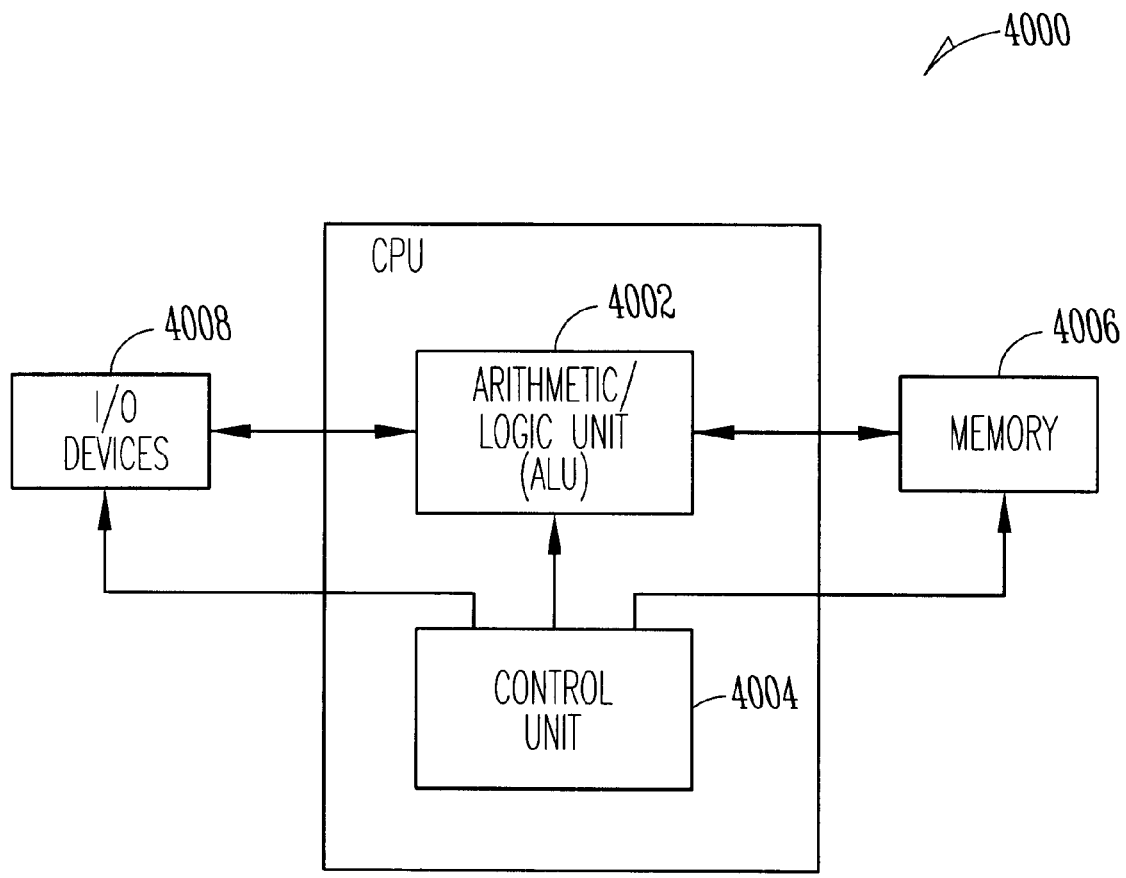
FIG. 40 is a simplified block diagram of a high-level organization of an electronic system according to the teachings of the present invention.

FIG. 40 is a simplified block diagram of a high-level organization of an electronic system according to the teachings of the present invention. The electronic system 4000 has functional elements, including a processor or arithmetic/logic unit (ALU) 4002, a control unit 4004, a memory device unit 4006 and an input/output (I/O) device 4008. Generally such an electronic system 4000 will have a native set of instructions that specify operations to be performed on data by the processor 4002 and other interactions between the processor 4002, the memory device unit 4006 and the I/O devices 4008. The control unit 4004 coordinates all operations of the processor 4002, the memory device 4006 and the I/O devices 4008 by continuously cycling through a set of operations that cause instructions to be fetched from the memory device 4006 and executed. Memory device can be implemented with the three terminal MRAM, according to the teachings of the present invention.

One of ordinary skill in the art will understand, upon reading and comprehending this disclosure, how to incorporate this MRAM technology into a variety of devices. These devices include giant magnetoresistance (GMR) devices, tunneling magnetoresistance (TMR) with magnetic tunnel junction (MTJ) devices, diode-isolated MTJ devices, transistor-isolated MTJ devices, and hall effect storage devices.

With respect to GMR technology, each memory cell is a "spin-valve"cell comprising two thin layers of ferromagnetic material separated by a thin layer of nonmagnetic metallic conducting material. The resistance of the sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

TMR uses magnetic tunnel junction (MTJ) devices. The MTJ device comprises two ferromagnetic layers separated by a thin, electrically insulating, tunnel barrier layer. The tunnel barrier layer is sufficiently thin that quantum-mechanical tunneling of charge carriers occurs between the ferromagnetic layers. The tunneling process is electron spin dependent which means that the tunneling current across the junction depends on the spin-dependent electronic properties of the ferromagnetic materials, and is a function of the relative orientation of the magnetic moments, or magnetization directions, of the two ferromagnetic layers. In the MTJ sensor, one ferromagnetic layer has its magnetic moment fixed or pinned, and the other ferromagnetic layer has its magnetic moment free to rotate in response to an external magnetic filed from the recording medium. When an electric potential is applied between the two ferromagnetic layers, the sensor resistance is a function of the tunneling current across the insulating layer between the ferromagnetic layers. Since the tunneling current that flows perpendicularly through the tunnel barrier layer depends on the relative magnetization directions of the two ferromagnetic layers, recorded data can be read from a magnetic medium because the signal field causes a change of direction of magnetization of the free layer, which in turn causes a change in resistance of the MTJ sensor, and a corresponding change in the sensed current or voltage.

A diode isolated MTJ device is a memory cell that includes a diode connected in series with an MTJ device. A transistor isolated MTJ device is a memory cell that includes a transistor connected in series with an MTJ. One reason for incorporating a diode or a transistor in series with an MTJ device is for read-select purposes; i.e. current is passed only through the selected MTJ.

A hall effect storage device is a memory device whose operation is based on the Hall effect. When a magnetic field is applied to a conductor carrying current, in a direction at right angles to the current, and electromotive force is produced across the conductor in a direction perpendicular to both the current and to the magnetic field. A hall effect storage device includes magnetic patch which stores data in the form of a magnetic field and a Hall-effect sensor for reading the stored data from the magnetic patch. Each sensor comprises a Hall bar and a detector means. As current is made to flow down the length of the Hall bar by an external means, a Hall voltage is developed across the Hall bar in a direction transverse to the direction of both the magnetic field and the current. The detector means is coupled to the Hall bar in such a way that it detects the Hall voltage, which itself is representative of the stored information. A magnetizing means is included for writing data or other information to each magnetic patch.

The figures presented and described in detail above are similarly useful in describing the method aspects of the present subject matter. The methods described below are nonexclusive as other methods may be understood from the specification and the figures described above.

One aspect provides a method of forming a memory array. According to one embodiment, word lines are provided in a first wiring layer, bit lines are provided in a second wiring layer and select lines are provided in a third wiring layer. Intersections are formed by the word lines, the bit lines and the select lines crossing each other. A magnetic storage element is provided proximate to each of the intersections such that the magnetic storage element is magnetically coupled to a first magnetic field produced by an energized word line, a second magnetic field produced by an energized bit line, and a third magnetic field produced by an energized select line. Other methods of forming a memory array and methods of forming a memory cell may be understood from the specification and the figures described above.

One aspect provides a method of writing to a magnetic storage device. According to one embodiment, a first, second and third magnetic field vectors are formed at the magnetic storage device such that the storage device is written by a vector sum of the first, second and third magnetic field vectors. According to one embodiment, the first, second and third magnetic field vectors are formed by energizing or directing a desired current through a first, second and third conductor, respectively. According to one embodiment, the second magnetic field vector is formed at an approximately 120 degree angle with respect to the first magnetic field vector, and the third magnetic field vector is formed at an approximately 60 degree angle with respect to the first magnetic field vector and at an approximately 60 degree angle with respect to the second magnetic field vector. According to one embodiment, the third magnetic field vector is aligned along an easy axis of magnetization for the magnetic storage device. According to one embodiment, the first magnetic field vector, the second magnetic field vector, and the third magnetic field vector are formed to have approximately equal strength at the magnetic storage device. According to one embodiment, the first magnetic field vector, the second magnetic field vector and third magnetic field vector are formed with an appropriate magnitude and direction to have approximately equal projections on an easy axis of magnetization for the magnetic storage device.

Conclusion

The present subject matter provides three terminal magnetic random access memory structures and methods. A word line, bit line and select line are energized to access a given bit. A significantly increased margin of safety or tolerance for the difference in magnetic susceptibility of the individual bit positions is achieved by energizing three lines rather than two lines. According to one embodiment described herein, the three magnetic field vectors attributable to the three energized lines have approximately equal projections on the easy axis of magnetization for the magnetic storage elements. As such, the three magnetic field vectors contribute equally to the motive force for moving the magnetic moment of the magnetic storage element. Thus, the probability of select errors is significantly diminished as compared to using two magnetic field vectors to provide the motive force for moving the magnetic moment of the magnetic storage element.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A memory cell, comprising:
   a first conductor line;
   a second conductor line;
   a third conductor line; and
   a magnetic storage element operably positioned to be magnetically coupled to a first magnetic field produced by an energized first conductor line, to a second magnetic field produced by an energized second conductor line, and to a third magnetic field produced by an energized third conductor line,
   wherein the magnetic storage element is adapted to be written by a vector sum of the first magnetic field, the second magnetic field, and the third magnetic field.

2. The memory cell of claim 1, wherein:
   the first magnetic field provides a first vector at the magnetic storage element, the second magnetic field provides a second vector at the magnetic storage element, and the third magnetic field provides a third vector at the magnetic storage element;
   the second vector and the first vector form an angle of approximately 120 degrees;
   the third vector and the first vector form an angle of approximately 60 degrees; and
   the third vector and the second vector form an angle of approximately 60 degrees.

3. The memory cell of claim 1, wherein the memory storage element has an easy axis of magnetization aligned with one of the magnetic fields.

4. The memory cell of claim 1, wherein:
   the first magnetic field provides a first vector at the magnetic storage element, the second magnetic field provides a second vector at the magnetic storage element, the third magnetic field provides a third vector at the magnetic storage element;
   the magnetic storage element has an easy axis of magnetization; and
   a projection of the first vector on the easy axis of magnetization approximately equals a projection of the second vector on the easy axis of magnetization and approximately equals a projection of the third vector on the easy axis of magnetization.

5. The memory cell of claim 1, wherein the first conductor line is formed as part of a first wiring layer for a memory array, the second conductor line is formed as part of a second wiring layer for the memory array, and the third conductor line is formed as part of a third wiring layer for the memory array.

6. The memory cell of claim 1, wherein the magnetic storage element is a magnetoresistance element, and the first conductor line and the second conductor line are electrically coupled to the memory storage element.

7. The memory cell of claim 1, wherein the magnetic storage element is a magnetic tunnel junction device.

8. The memory cell of claim 1, wherein the magnetic storage element is a diode isolated magnetic tunnel junction device.

9. The memory cell of claim 1, wherein the magnetic storage element is a transistor isolated magnetic tunnel junction device.

10. The memory cell of claim 1, wherein the magnetic storage element is a giant magnetoresistance device.

11. The memory cell of claim 1, wherein the magnetic storage element is a hall effect device.

12. A memory array, comprising:
    at least one magnetic storage element;
    at least one first conductor line;
    at least one second conductor line; and
    at least one third conductor line,
    wherein the at least one first conductor line, the at least one second conductor line, and the at least one third conductor line cross each other proximate to at least one intersection point,
    wherein an energized first conductor line produces a first magnetic field, an energized second conductor line produces a second magnetic field, and an energized third conductor line produces a third magnetic field, and
    wherein the at least one magnetic storage element is proximately located to the at least one intersection point, and is adapted to be written by being magnetically coupled to the first magnetic field, the second magnetic field and the third magnetic field.

13. The memory array of claim 12, wherein the at least one first conductor line, the at least one second conductor line, and the at least one third conductor line lie in approximately parallel planes.

14. The memory array of claim 12, wherein the magnetic storage element is a magnetic tunnel junction device.

15. The memory array of claim 12, wherein the magnetic storage element is a diode isolated magnetic tunnel junction device.

16. The memory array of claim 12, wherein the magnetic storage element is a transistor isolated magnetic tunnel junction device.

17. The memory array of claim 12, wherein the magnetic storage element is a giant magnetoresistance device.

18. The memory array of claim 12, wherein the magnetic storage element is a hall effect device.

19. The memory array of claim 12, wherein:
    the first magnetic field provides a first vector at the magnetic storage element, the second magnetic field provides a second vector at the magnetic storage element, the third magnetic field provides a third vector at the magnetic storage element;
    the magnetic storage element has an easy axis of magnetization; and
    a projection of the first vector on the easy axis of magnetization approximately equals a projection of the second vector on the easy axis of magnetization and approximately equals a projection of the third vector on the easy axis of magnetization.

20. The memory array of claim 12, wherein:

the first magnetic field provides a first vector at the magnetic storage element, the second magnetic field provides a second vector at the magnetic storage element, and the third magnetic field provides a third vector at the magnetic storage element;

the second vector and the first vector form an angle of approximately 120 degrees;

the third vector and the first vector form an angle of approximately 60 degrees; and the third vector and the second vector form an angle of approximately 60 degrees.

21. The memory array of claim 12, wherein the magnetic storage element has an easy axis of magnetization that is aligned with one of the magnetic fields.

22. A memory array, comprising:

a first wiring layer;

a second wiring layer;

a third wiring layer; and a layer of magnetic storage elements, wherein each wiring layer includes approximately parallel plane conductors, wherein the conductors of the first wiring layer cross the conductors of the second wiring layer at intersections, wherein the conductors of the third wiring layer cross the conductors of the first wiring layer and the second wiring layer at the intersections, wherein an energized conductor of the first wiring layer produces a first magnetic field, wherein an energized conductor of the second wiring layer produces a second magnetic field, wherein an energized conductor of the third wiring layer produces a third magnetic field, and wherein the magnetic storage elements are proximately located to the intersections, and are adapted to be written by being magnetically coupled to the first magnetic field, the second magnetic field and the third magnetic field.

23. The memory array of claim 22, wherein the conductors of the wiring layers include metal conductors.

24. The memory array of claim 22, wherein the conductors of the wiring layers include copper conductors.

25. The memory array of claim 22, wherein the conductors of the wiring layers include copper alloy conductors.

26. The memory array of claim 22, wherein the layer of magnetic storage elements is positioned between the first wiring layer and the second wiring layer.

27. The memory array of claim 22, wherein each of the magnetic storage elements has an easy axis of magnetization aligned with the third magnetic field.

28. The memory array of claim 22, wherein the conductors of the first wiring layer are oriented approximately 60 degrees with respect to the conductors of the second wiring layer, and wherein the conductors of the third wiring layer are oriented approximately 60 degrees with respect to the conductors of the first wiring layer and the second wiring layer.

29. The memory array of claim 22, wherein:

the first magnetic field provides a first vector at the magnetic storage element, the second magnetic field provides a second vector at the magnetic storage element, and the third magnetic field provides a third vector at the magnetic storage element;

the magnetic storage element has an easy axis of magnetization; and a projection of the first vector on the easy axis of magnetization approximately equals a projection of the second vector on the easy axis of magnetization and approximately equals a projection of the third vector on the easy axis of magnetization.

30. A memory system, comprising:

a memory array, including:

at least one magnetic storage element;

at least one word line;

at least one bit line; and at least one select line, wherein the at least one word line, the at least one bit line, and the at least one select line cross each other proximate to at least one intersection point, wherein an energized word line produces a first magnetic field, an energized bit line produces a second magnetic field, and an energized select line produces a third magnetic field, and wherein the at least one magnetic storage element is proximately located to the at least one intersection point, and is adapted to be written by being magnetically coupled to the first magnetic field, the second magnetic field and the third magnetic field;

word line control circuitry coupled to the at least one word line;

bit line control circuitry coupled to the at least one bit line; and select line control circuitry coupled to the at least one select line, wherein the word line control circuitry, the bit line control circuitry, and the select line control circuitry are adapted to cooperate to energize a desired word line, a desired bit line, and a desired select line to write data to a desired magnetic storage element.

31. The memory system of claim 30, wherein the at least one word line, the at least one bit line, and the at least one select line include metal conductors.

32. The memory system of claim 30, wherein the at least one word line, the at least one bit line, and the at least one select line include copper conductors.

33. The memory system of claim 30, wherein the at least one word line, the at least one bit line, and the at least one select line include copper alloy conductors.

34. The memory system of claim 30, wherein the magnetic storage element is a magnetic tunnel junction device.

35. The memory system of claim 30, wherein the magnetic storage element is a diode isolated magnetic tunnel junction device.

36. The memory system of claim 30, wherein the magnetic storage element is a transistor isolated magnetic tunnel junction device.

37. The memory system of claim 30, wherein the magnetic storage element is a giant magnetoresistance device.

38. The memory system of claim 30, wherein the magnetic storage element is a hall effect device.

39. The memory system of claim 30, wherein:

the first magnetic field provides a first vector at the magnetic storage element, the second magnetic field provides a second vector at the magnetic storage element, the third magnetic field provides a third vector at the magnetic storage element;

the magnetic storage element has an easy axis of magnetization; and a projection of the first vector on the easy axis of magnetization approximately equals a projection of the second vector on the easy axis of magnetization and approximately equals a projection of the third vector on the easy axis of magnetization.

40. The memory system of claim 30, wherein:
the first magnetic field provides a first vector at the magnetic storage element, the second magnetic field provides a second vector at the magnetic storage element, and the third magnetic field provides a third vector at the magnetic storage element;
the second vector and the first vector form an angle of approximately 120 degrees;
the third vector and the first vector form an angle of approximately 60 degrees; and
the third vector and the second vector form an angle of approximately 60 degrees.

41. The memory system of claim 30, wherein the magnetic storage element has an easy axis of magnetization that is aligned with one of the magnetic fields.

42. The memory system of claim 30, wherein the word line control circuitry is adapted to generate a current flow in either direction along the desired word line, the bit line control circuitry is adapted to generate a current flow in either direction along the desired bit line, and the select line control circuitry is adapted to generate a current flow in either direction along the desired select line.

43. The memory system of claim 30, wherein the word line control circuitry is adapted to generate a current of sufficient magnitude to produce a desired strength for the first magnetic field at the magnetic storage element, the bit line control circuitry is adapted to generate a current of sufficient magnitude to produce a desired strength for the second magnetic field at the magnetic storage element, and the select line control circuitry is adapted to generate a current of sufficient magnitude to produce a desired strength for the third magnetic field at the magnetic storage element.

44. A method for writing to a magnetic storage device, comprising:
forming a first magnetic field vector at the magnetic storage device;
forming a second magnetic field vector at the magnetic storage device; and
forming a third magnetic field vector at the magnetic storage device,
wherein the storage device is written by a vector sum of the first magnetic field vector, the second magnetic field vector and the third magnetic field vector.

45. The method of claim 44, wherein forming a first magnetic field vector includes directing current through a first conductor, forming a second magnetic field vector includes directing current through a second conductor, and forming a third magnetic field vector includes directing current through a third conductor.

46. The method of claim 44, wherein forming a second magnetic field vector includes forming the second magnetic field vector at an approximately 120 degree angle with respect to the first magnetic field vector, and forming a third magnetic field vector includes forming the third magnetic field vector at an approximately 60 degree angle with respect to the first magnetic field vector and at an approximately 60 degree angle with respect to the second magnetic field vector.

47. The method of claim 44, wherein forming a third magnetic field vector includes aligning the third magnetic field vector along an easy axis of magnetization for the magnetic storage device.

48. The method of claim 44, wherein the first magnetic field vector, the second magnetic field vector, and the third magnetic field vector are formed to have approximately equal strength at the magnetic storage device.

49. The method of claim 44, wherein the first magnetic field vector, the second magnetic field vector and third magnetic field vector are formed with an appropriate magnitude and direction to have approximately equal projections on an easy axis of magnetization for the magnetic storage device.

50. A method for writing to a magnetic storage device, comprising:
energizing a word line to generate a first magnetic field vector through the magnetic storage device;
energizing a bit line to generate a second magnetic field vector through the magnetic storage device; and
energizing a select line to generate a third magnetic field vector through the magnetic storage device.

51. The method of claim 50, wherein energizing a word line, energizing a bit line, and energizing a select line all include controlling current flow direction.

52. The method of claim 50, wherein energizing a word line, energizing a bit line, and energizing a select line all include providing a current of a desired magnitude to generate a desired magnetic field vector.

53. The method of claim 50, wherein energizing a word line, energizing a bit line, and energizing a select line all include providing a magnetic field vector that has a desired projection on an easy axis of magnetization for the magnetic storage device.

54. The method of claim 50, wherein energizing a word line, energizing a bit line, and energizing a select line include energizing three conductors separated from each other by an approximate 60 degree angle.

55. A method of forming a memory cell, comprising:
providing a first conductor line, wherein an energized first conductor line provides a first magnetic field;
providing a second conductor line to cross the first conductor line at an intersection point, wherein an energized second conductor line provides a second magnetic field;
providing a third conductor line to cross the first conductor line and the second conductor line at the intersection point, wherein an energized third conductor line provides a third magnetic field; and
providing a magnetic storage element proximate to the intersection point to be magnetically coupled to the first magnetic field, the second magnetic field, and the third magnetic field,
wherein a vector sum of the first magnetic field, the second magnetic field and the third magnetic field is sufficient to write the magnetic storage element.

56. The method of claim 55, wherein providing the second conductor line includes orienting the second conductor line to form an approximate 60 degree angle between the first and second conductor lines, and providing a third conductor line includes orienting the third conductor line to form an approximate 60 degree angle between the first and third conductor lines and an approximate 60 degree angle between the second and third conductor lines.

57. The method of claim 55, wherein providing a magnetic storage element includes providing a magnetic storage element between the first conductor line and the second conductor line.

58. The method of claim 55, wherein providing a magnetic storage element includes providing a magnetoresistance element, and electrically coupling the magnetoresistance element to the first conductor line and to the second conductor line.

59. The method of claim 55, wherein providing a first conductor line, providing a second conductor line and providing a third conductor line all include providing a metal conductor line.

60. The method of claim 55, wherein providing a first conductor line, providing a second conductor line and providing a third conductor line all include providing a copper conductor line.

61. The method of claim 55, wherein providing a first conductor line, providing a second conductor line and providing a third conductor line all include providing a copper alloy conductor line.

62. A method of forming a memory array, comprising:

providing word lines in a first wiring layer, bit lines in a second wiring layer and select lines in a third wiring layer to form intersections, wherein each of the intersections includes one of the word lines, one of the bit lines and one of the select lines crossing each other; and providing a magnetic storage element proximate to each of the intersections such that the magnetic storage element is magnetically coupled to a first magnetic field produced by an energized word line, a second magnetic field produced by an energized bit line, and a third magnetic field produced by an energized select line.

63. The method of claim 62, wherein providing word lines in a first wiring layer, bit lines in a second wiring layer and select lines in a third wiring layer to form intersection points includes orientating the bit lines to form an approximate 60 degree angle with respect to the word lines, and orientating the select lines to form an approximate 60 degree angle with respect to the word lines and an approximate 60 degree angle with respect to the bit lines.

64. The method of claim 62, wherein providing a magnetic storage element proximate to each of the intersections includes providing the magnetic storage element between the word line and the bit line.

65. The method of claim 62, wherein providing a magnetic storage element proximate to each of the intersections includes providing a magnetoresistance device, and coupling the magnetoresistance device to the corresponding word line and bit line for the intersection.

66. A method of forming a memory array, comprising:

forming a plurality of parallel word lines in a first wiring layer;

forming a plurality of parallel bit lines in a second wiring layer oriented with a predetermined angle with respect to the parallel word lines to form intersections;

forming a plurality of parallel select lines in a third wiring layer oriented with a predetermined angle with respect to the parallel word lines and a predetermined angle with respect to the parallel bit lines, and further positioned to cross the parallel word lines and the parallel bit lines at the intersections; and providing a plurality of magnetic storage elements in a predetermined pattern such that each magnetic storage element is proximate to one of the intersections and is adapted to be magnetically coupled to a word magnetic field produced by an energized word line, a bit magnetic field produced by an energized bit line, and a select magnetic field produced by an energized select line.

67. The method of claim 66, wherein providing a plurality of magnetic storage elements includes providing a layer of magnetic storage elements between the first wiring layer and the second wiring layer.

68. The method of claim 66, wherein providing a plurality of magnetic storage elements includes providing a plurality of magnetic tunnel junction devices.

69. The method of claim 66, wherein providing a plurality of magnetic storage elements includes providing a plurality of diode isolated magnetic tunnel junction devices.

70. The method of claim 66, wherein providing a plurality of magnetic storage elements includes providing a plurality of transistor isolated magnetic tunnel junction devices.

71. The method of claim 66, wherein providing a plurality of magnetic storage elements includes providing a plurality of giant magnetoresistance devices.

72. The method of claim 66, wherein providing a plurality of magnetic storage elements includes providing a plurality of hall effect devices.

73. The method of claim 66, wherein forming a plurality of parallel bit lines in a second wiring layer includes orienting the parallel bit lines approximately 60 degrees with respect to the parallel word lines, and forming a plurality of parallel select lines in a third wiring layer includes orienting the parallel select lines approximately 60 degrees with respect to the parallel word lines and approximately 60 degrees with respect to the parallel bit lines.

* * * * *

UNITED STATES PATENT AND TRADEMARK OFFICE
CERTIFICATE OF CORRECTION

PATENT NO.      : 6,510,080 B1
DATED           : January 21, 2003
INVENTOR(S)     : Paul A. Farrar It is certified that error appears in the above-identified patent and that said Letters Patent is hereby corrected as shown below:

Column 1,
Line 27, delete "ccess" and insert -- access -- therefor.

Column 8,
Line 27, delete "$I^{WORD}$" and insert -- $I_{WORD}$ -- therefor.
Line 50, delete "$I^{BIT}$" and insert -- $I_{BIT}$ -- therefor.

Column 9,
Line 28, delete "." after "Circuitry".
Line 29, insert -- . -- after "2646".

Column 10,
Line 38, delete "been" after "have".
Line 63, insert -- . -- after "(0.5)".

Column 11,
Line 1, delete "$*\cos(^{60°})$" and insert -- $*\cos(60°)$ -- therefor.

Signed and Sealed this

Fifth Day of August, 2003

JAMES E. ROGAN
*Director of the United States Patent and Trademark Office*